US007989772B2

(12) United States Patent
Yagi et al.

(10) Patent No.: US 7,989,772 B2
(45) Date of Patent: Aug. 2, 2011

(54) RADIATION IMAGING APPARATUS, ITS CONTROL METHOD, AND RECORDING MEDIUM STORING PROGRAM FOR EXECUTING THE CONTROL METHOD

(75) Inventors: Tomoyuki Yagi, Honjo (JP); Tadao Endo, Honjo (JP); Toshio Kameshima, Kumagaya (JP); Katsuro Takenaka, Honjo (JP); Keigo Yokoyama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 223 days.

(21) Appl. No.: 11/721,281

(22) PCT Filed: Nov. 27, 2006

(86) PCT No.: PCT/JP2006/324121

§ 371 (c)(1),
(2), (4) Date: Aug. 17, 2009

(87) PCT Pub. No.: WO2007/063997

PCT Pub. Date: Jun. 7, 2007

(65) Prior Publication Data

US 2009/0294679 A1 Dec. 3, 2009

(30) Foreign Application Priority Data

Nov. 29, 2005 (JP) ................................ 2005-344537
Nov. 10, 2006 (JP) ................................ 2006-305241

(51) Int. Cl.
*G01D 18/00* (2006.01)

(52) U.S. Cl. ................................ 250/370.09; 250/208.1

(58) Field of Classification Search ............. 250/370.09, 250/205

See application file for complete search history.

(56) References Cited

U.S. PATENT DOCUMENTS

| | | | | |
|---|---|---|---|---|
| 6,075,256 | A | 6/2000 | Kaifu et al. | 257/53 |
| 6,828,539 | B1 * | 12/2004 | Kuwabara | 250/208.1 |
| 6,952,015 | B2 | 10/2005 | Kameshima | 250/370.11 |
| 6,952,464 | B2 | 10/2005 | Endo | 378/98.11 |
| 6,965,111 | B2 | 11/2005 | Endo | 250/370.1 |
| 6,985,555 | B2 | 1/2006 | Endo | 378/98.11 |
| 7,002,157 | B2 | 2/2006 | Kameshima | 250/370.11 |
| 7,012,260 | B2 | 3/2006 | Endo | 250/370.11 |
| 7,138,639 | B2 | 11/2006 | Kameshima | 250/370.11 |

(Continued)

FOREIGN PATENT DOCUMENTS

EP 1 176 814 A2 1/2002

(Continued)

*Primary Examiner* — David P Porta
*Assistant Examiner* — Djura Malevic
(74) *Attorney, Agent, or Firm* — Fitzpatrick, Cella, Harper & Scinto

(57) ABSTRACT

To provide a radiation imaging apparatus capable of restraining the change of image qualities due to the change of sensitivities of an MIS-type photoelectric conversion element and its control method. Therefore, an MIS-type photoelectric conversion element 217 is set to a saturation state before performing radiation imaging. As means for realizing the above mentioned, a light source 601, power supply 603 for making the light source 601 emit light, and switch 605 are provided. The light source 601 can use a light source capable of discharging the light having a wavelength which can be detected by a photoelectric conversion layer 209 at optional timing. For example, it is possible to use a light source in which a plurality of LEDs or cold cathode ray tubes are arranged, a light guide plate is combined with an LED or cold cathode ray tube, or an EL device.

13 Claims, 20 Drawing Sheets

U.S. PATENT DOCUMENTS

| | | | | |
|---|---|---|---|---|
| 7,154,099 | B2 | 12/2006 | Endo | 250/370.11 |
| 7,227,926 | B2 | 6/2007 | Kameshima et al. | 378/98.9 |
| 7,777,167 | B2 * | 8/2010 | Takeda et al. | 250/205 |
| 2002/0024016 | A1 | 2/2002 | Endo | 250/370.11 |
| 2003/0038242 | A1 | 2/2003 | Endo | 250/370.14 |
| 2004/0079891 | A1 | 4/2004 | Sato et al. | 250/370.12 |
| 2004/0114719 | A1 * | 6/2004 | Endo | 378/98.8 |
| 2004/0179649 | A1 * | 9/2004 | Yagi | 378/97 |
| 2004/0217294 | A1 * | 11/2004 | Zur | 250/370.09 |
| 2004/0247079 | A1 * | 12/2004 | Endo | 378/98.12 |
| 2005/0109927 | A1 | 5/2005 | Takenaka et al. | 250/252.1 |
| 2005/0199834 | A1 | 9/2005 | Takenaka et al. | 250/580 |
| 2005/0200720 | A1 | 9/2005 | Kameshima et al. | 348/220.1 |
| 2005/0220269 | A1 | 10/2005 | Endo et al. | 378/114 |
| 2005/0264665 | A1 | 12/2005 | Endo et al. | 348/308 |
| 2006/0119719 | A1 | 6/2006 | Kameshima | 348/308 |
| 2006/0192130 | A1 | 8/2006 | Yagi | 250/370.14 |
| 2006/0289774 | A1 | 12/2006 | Endo et al. | 250/370.09 |
| 2007/0040099 | A1 | 2/2007 | Yokoyama et al. | 250/208.1 |
| 2007/0069144 | A1 | 3/2007 | Kameshima | 250/370.09 |
| 2007/0080299 | A1 | 4/2007 | Endo et al. | 250/370.09 |
| 2007/0096032 | A1 | 5/2007 | Yagi et al. | 250/370.11 |
| 2007/0125952 | A1 | 6/2007 | Endo et al. | 250/369 |
| 2007/0131843 | A1 | 6/2007 | Yokoyama et al. | 250/205 |
| 2007/0183573 | A1 | 8/2007 | Kameshima et al. | 378/98.9 |
| 2007/0210258 | A1 | 9/2007 | Endo et al. | 250/370.09 |

FOREIGN PATENT DOCUMENTS

| | | | |
|---|---|---|---|
| EP | 1 267411 | A2 | 12/2002 |
| EP | 1 394 567 | A2 | 3/2004 |
| JP | 6-326286 | | 11/1994 |
| JP | 2002-40144 | | 2/2002 |
| JP | 2003-78124 | | 3/2003 |
| JP | 2004-146769 | | 5/2004 |
| JP | 2005-6790 | | 1/2005 |

* cited by examiner

PHOTOELECTRIC CONVERSION MODE

SATURATED STATE

REFRESH MODE

RADIATION IMAGING APPARATUS, ITS CONTROL METHOD, AND RECORDING MEDIUM STORING PROGRAM FOR EXECUTING THE CONTROL METHOD

TECHNICAL FIELD

The present invention relates to a radiation imaging apparatus to be preferably used for diagnosis for medical care and industrial non-destructive inspection and its control method. In the case of the present invention, it is assumed that electromagnetic waves such as X ray and γ ray and α ray and β ray are included in radiation.

BACKGROUND ART

In recent years, an X-ray digital imaging apparatus for performing imaging by using a converter such as a photoelectric transducer for converting light into an electrical signal and thereby using radiation such as X ray is practically used and spread in accordance with the advancement of semiconductor technology.

Because a digital X-ray imaging apparatus has a sensitivity and image quality superior to those of a conventional film-type imaging apparatus, imaging at lower dose and improvement of diagnosability are possible. Moreover, because an image is stored as digital data, there are advantages that the image can be worked to an image which can be further diagnosed and the image can be easily controlled by performing various image processings after imaging the image. Moreover, by effectively using the advantage of digital data and thereby using a network to transfer image data, it is possible to make the image diagnosis in a hospital efficient and remote diagnosis efficient or realize new medical care service.

By using a digital X-ray imaging apparatus having these advantages, it is possible to provide medical care service higher than the case of a convention X-ray imaging apparatus in quality such as improvement of diagnostic accuracy, making diagnosis efficient, or development to new medical care service.

The above digital X-ray imaging apparatus is disclosed in U.S. Pat. No. 6,965,111 for example.

As a photoelectric conversion element used for the pixel of a two-dimensional area sensor of the X-ray imaging apparatus disclosed in U.S. Pat. No. 6,965,111, an MIS-type conversion element such as an MIS (Metal-Insulator-Semiconductor)-type photoelectric conversion element is mainly used and as a switching device, a TFT (Thin Film Transistor) is mainly used. The two-dimensional area sensor using the MIS-type photoelectric conversion element performs the operation for initializing an MIS-type photoelectric conversion element referred to as the refresh operation disclosed in U.S. Pat. No. 6,075,256.

DISCLOSURE OF THE INVENTION

However, a state in which a refresh operation is not effective is present in an MIS-type photoelectric conversion element. Moreover, because the state is present, a change of sensitivities occurs. As a result, stable image quality is not obtained.

It is an object of the present invention to provide an imaging apparatus capable of restraining a change of image qualities due to a change of sensitivities of a photoelectric conversion element and its control method.

According to the present invention, it is possible to restrain the sensitivity change of a conversion element. Therefore, it is possible to restrain the fluctuation or image uncomfortable feeling of image luminance and obtain an image having a high image quality.

Further features of the present invention will become apparent from the following description of exemplary embodiments with reference to the attached drawings.

BEST MODE FOR CARRYING OUT THE INVENTION

Hereafter, an embodiment of the present invention is specifically described by referring to the accompanying drawings.

Figure 1:
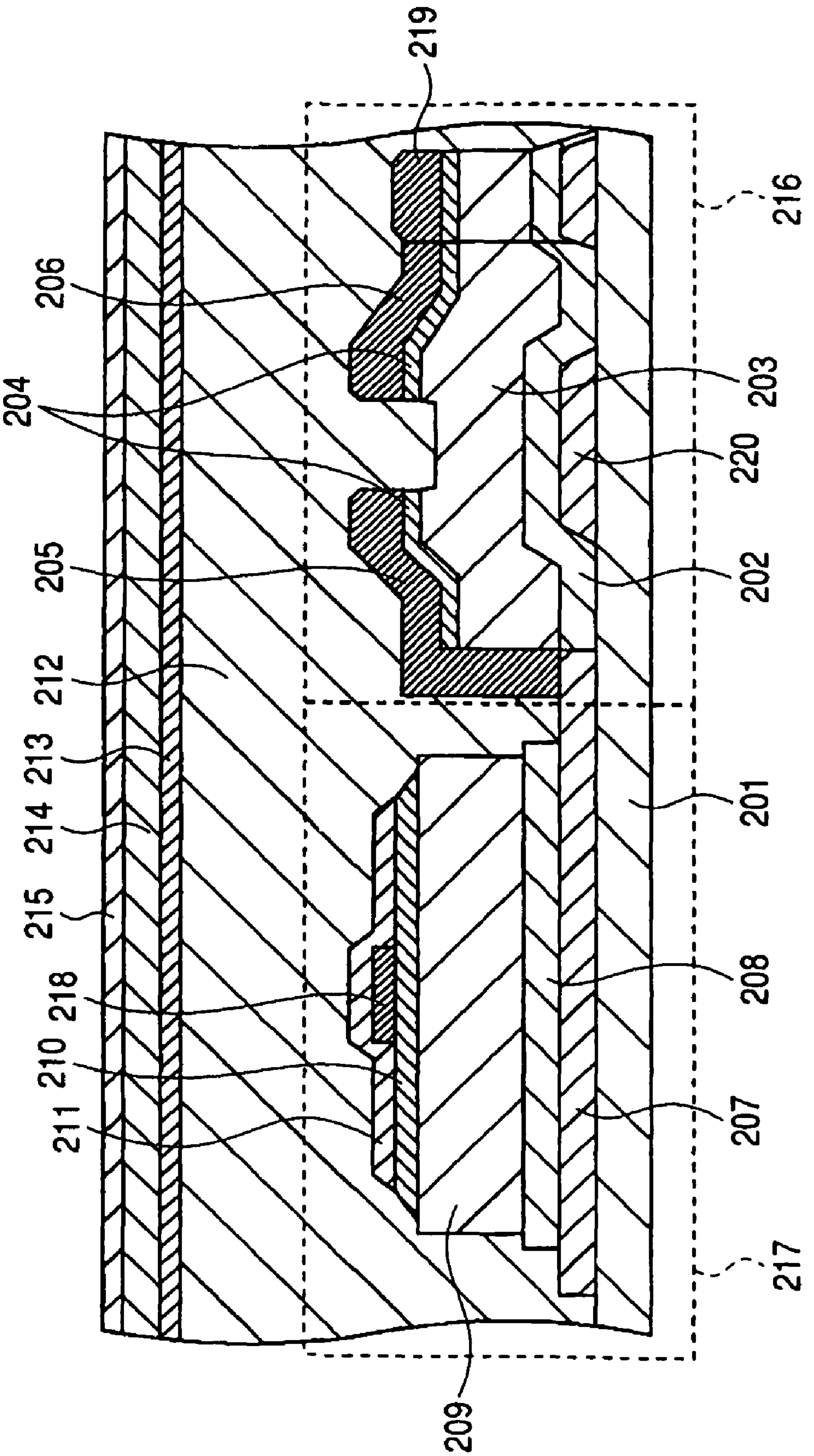
FIG. 1 is a sectional view showing the structure of a pixel using an MIS-type photoelectric conversion element.

First, the structure of a pixel using an MIS-type photoelectric conversion element is described by referring to FIG. 1. A TFT 216 is formed on a glass substrate 201. Moreover, a gate line 220, gate insulating film 202, channel layer 203, $N^+$ amorphous silicon layer 204, drain electrode 205, and source electrode 206 are formed on the TFT 216. Furthermore, a signal line 219 for transferring an electrical signal output from the TFT 216 to a signal amplifying circuit is connected to the source electrode 206.

The MIS-type photoelectric conversion element 217 serving as an MIS-type conversion element is also formed on a glass substrate. Moreover, a sensor bottom electrode layer 207, insulting layer 208, photoelectric conversion layer 209, $N^+$ amorphous silicon layer 210, transparent electrode 211, and sensor bias line 218 are formed on the MIS-type photoelectric conversion element 217. A voltage is supplied from the transparent electrode 211 and sensor bias line 218 to the photoelectric conversion layer 209. The $N^+$ amorphous silicon layer 210 has an ohmic contact with the photoelectric conversion layer 209 and transparent electrode 211, which is a layer for blocking implantation of positive holes from the sensor bias line 218.

Moreover, a protective layer 212 for protecting the MIS-type photoelectric conversion element 217 and TFT 216 from humidity and foreign matter, phosphor 214 for converting radiation into light, adhesive layer 213 for adhering the phosphor 214 to the protective layer 212, and phosphor protective layer 215 are formed. The phosphor protective layer 215 protects the phosphor 214 from humidity or the like.

Figure 2A:
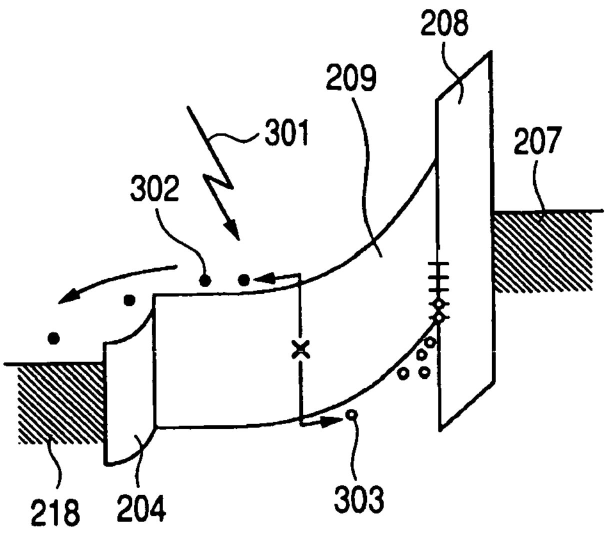
FIG. 2A is an energy band diagram for explaining the photoelectric conversion mode of an MIS-type photoelectric conversion element.
Figure 2B:
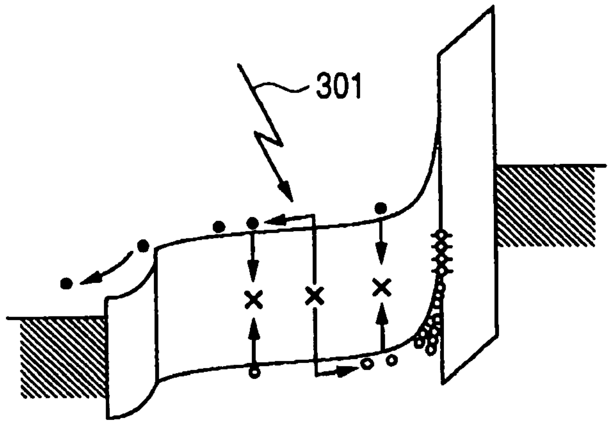
FIG. 2B is an energy band diagram for explaining the saturation state of an MIS-type photoelectric conversion element.
Figure 2C:
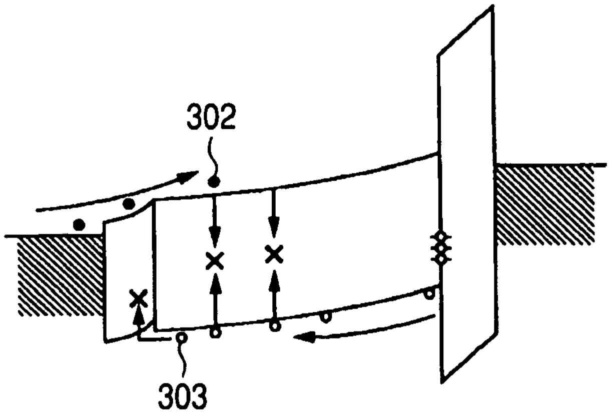
FIG. 2C is an energy band diagram for explaining the refresh mode of an MIS-type photoelectric conversion element.

Then, the operational principle of the MIS-type photoelectric conversion element is described by referring to the energy band diagram of the MIS-type photoelectric conversion element shown in FIGS. 2A to 2C.

In the case of the photoelectric conversion mode shown in FIG. 2A, a positive voltage is applied to the sensor bias line 218 of the MIS-type photoelectric conversion element 217 and positive holes are accumulated. In the photoelectric conversion mode, when light 301 is irradiated to the photoelectric conversion layer 209, positive hole 303 and electron 302 are generated by the photoelectric effect in the photoelectric conversion layer 209. Then, the positive hole 303 is moved to the interface between the insulating layer 208 and photoelectric conversion layer 209 by an electric field and the electron 302 is moved to the N+ amorphous silicon layer 210 side. In this case, because the positive hole 303 cannot pass through the insulting layer 208, it is accumulated on the interface between the photoelectric conversion layer 209 and the insulating layer 208. When the positive hole 303 is accumulated, a voltage proportional to the dose of the light 301 or time is generated in the MIS-type photoelectric conversion element 217 and the potential of the bottom electrode layer 207 is lowered.

When the TFT 216 is turned on under the above state, current flows through the bottom electrode layer 207 and it is possible to obtain an image signal by detecting the current.

However, when a certain number of the positive holes 303 is accumulated, the saturation state shown in FIG. 2B is realized. That is, the voltage due to the positive holes 303 accumulated on the interface between the photoelectric conversion layer 209 and the insulating layer 208 becomes equal to the voltage applied to the MIS-type photoelectric conversion element 217 and an electric field is not generated in the photoelectric conversion layer 209. Under this state, the positive hole 303 generated in the photoelectric conversion layer 209 cannot move up to the interface between the photoelectric conversion layer 209 and the insulating layer 208 and the positive hole 303 is recombined with the electron 302 and disappears. Therefore, a voltage proportional to the dose of the light 301 or time is not generated. Then, because a voltage proportional to the dose of the light 301 or time is not generated in the saturated MIS-type photoelectric conversion element 217, the sensitivity is lowered and a normal X-ray image cannot be obtained.

That is, the light sensitivity of the MIS-type photoelectric conversion element 217 depends on the voltage applied to the photoelectric conversion layer 209. The positive hole 303 generated by photoelectric effect is moved by an electric field applied to the photoelectric conversion layer 209 and reaches the interface between the photoelectric conversion layer 209 and the insulating layer 208. When this time does not become shorter than the life time of the positive hole 303 decided by the film quality of the photoelectric conversion layer 209, the positive hole 303 cannot reach the interface between the photoelectric conversion layer 209 and the insulating layer 208 and it disappears. Therefore, it is impossible to take out the positive hole 303 as an electrical signal. Therefore, to securely take out the positive hole 303 generated by photoelectric effect, it is necessary to increase the moving speed of the positive hole 303, that is, apply a sufficient voltage to the photoelectric conversion layer 209.

To return the MIS-type photoelectric conversion element 217 to the state of the photoelectric conversion mode shown in FIG. 2A again, it is necessary to set the voltage of the sensor bias line 218 to a voltage lower than that of the state in FIG. 2B and remove the positive hole 303 accumulated on the interface between the photoelectric conversion layer 209 and the insulating layer 208.

By performing the above operation, the refresh mode shown in FIG. 2C is realized and it is possible to newly accumulate positive holes 303 in the photoelectric conversion mode by the removed number of positive holes 303. Therefore, by setting the sensor bias to be supplied at the time of refresh operation to a lower value, it is possible that a sensor does not easily become a saturation state even if much light is irradiated. Moreover, it is possible to keep the voltage applied to the photoelectric conversion layer 209 constant by this refresh operation before light irradiation. Therefore, in the state in which the refresh operation is effective, sensitivities are not changed.

However, immediately after the refresh mode is changed to the photoelectric conversion mode, current due to electrons implanted into the MIS-type photoelectric conversion element 217 in the refresh mode flows. Therefore, dark current is temporarily increased. Moreover, the number of electrons implanted into the photoelectric conversion layer 209 is increased as the sensor bias at the time of refresh is lowered. Therefore, sensor biases in the refresh mode and photoelectric conversion mode are selected in view of the dynamic range desired for a digital X-ray imaging apparatus and dark current.

Figure 3:
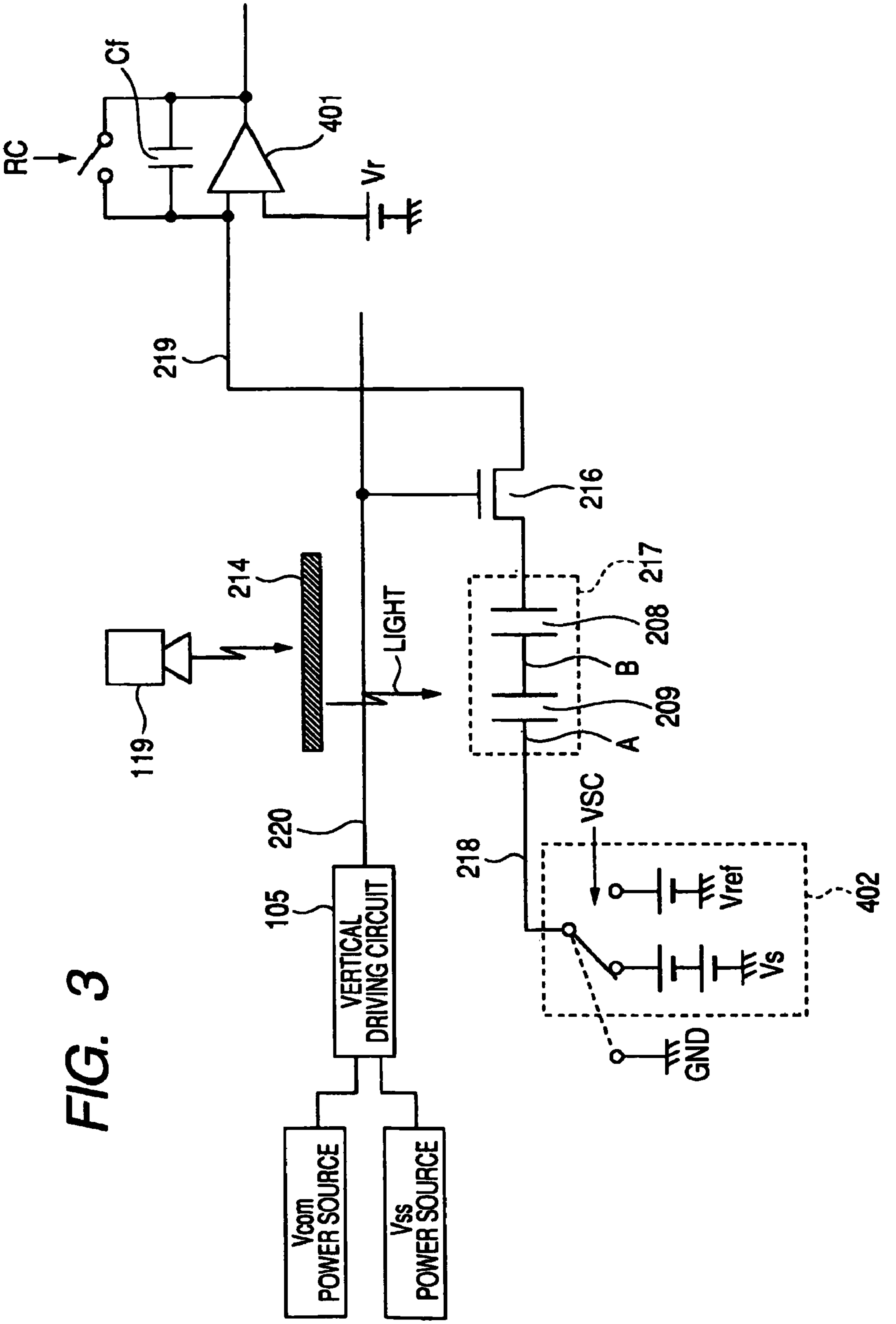
FIG. 3 is a circuit diagram showing the configuration of one pixel of a two-dimensional sensor of an X-ray imaging apparatus.

Then, in the case of the above MIS-type photoelectric conversion element, a state in which the refresh operation is not effective is described below. FIG. 3 is a circuit diagram showing the configuration of one pixel of the two-dimensional sensor (sensor unit) in an X-ray imaging apparatus.

As described above, one pixel includes the TFT 216 and MIS-type photoelectric conversion element 217. Moreover, the gate line 220 is connected to the gate of the TFT 216 and the signal line 219 is connected to the source electrode 206 of the TFT 216. Moreover, the sensor bias line 218 for applying a voltage required to perform photoelectric conversion and refresh is connected to the MIS-type photoelectric conversion element 217. The signal line 219, gate line 220, and sensor bias line 218 are shared by a plurality of pixels constituting a two-dimensional sensor.

The gate line 220 is connected to a vertical driving circuit 105 and a voltage for selectively turning on/off the TFT 216 is supplied from the vertical driving circuit 105. The sensor bias line 218 is connected to a sensor power supply 402. The sensor power supply 402 includes a power supply Vs for photoelectric conversion and a power supply Vref necessary for the refresh of a sensor, in which power supply outputs can be optionally changed by a control signal VSC. The signal line 219 connects the source electrode 206 of the TFT 216 and the input of a signal amplifying circuit constituted by using a current-integrating-type amplifier 401. The amplifier 401 converts a current signal corresponding to electric charges transferred from the TFT 216 accumulated in the MIS-type photoelectric conversion element 217 into a voltage signal and amplifies the signal. The current input to the amplifier 401 is accumulated in an integrating capacitor Cf to output voltages proportional to voltages generated at the both ends of the integrating capacitor Cf.

When reading the electric charges accumulated in the MIS-type photoelectric conversion element 217, it is necessary to reset electric charges accumulated at the time of latest read or electric charges accumulated by the offset current of the amplifier 401. The integrating capacitor Cf is reset by turning on a switch SW following the integrating capacitor Cf in accordance with a control signal RC.

Figure 4:
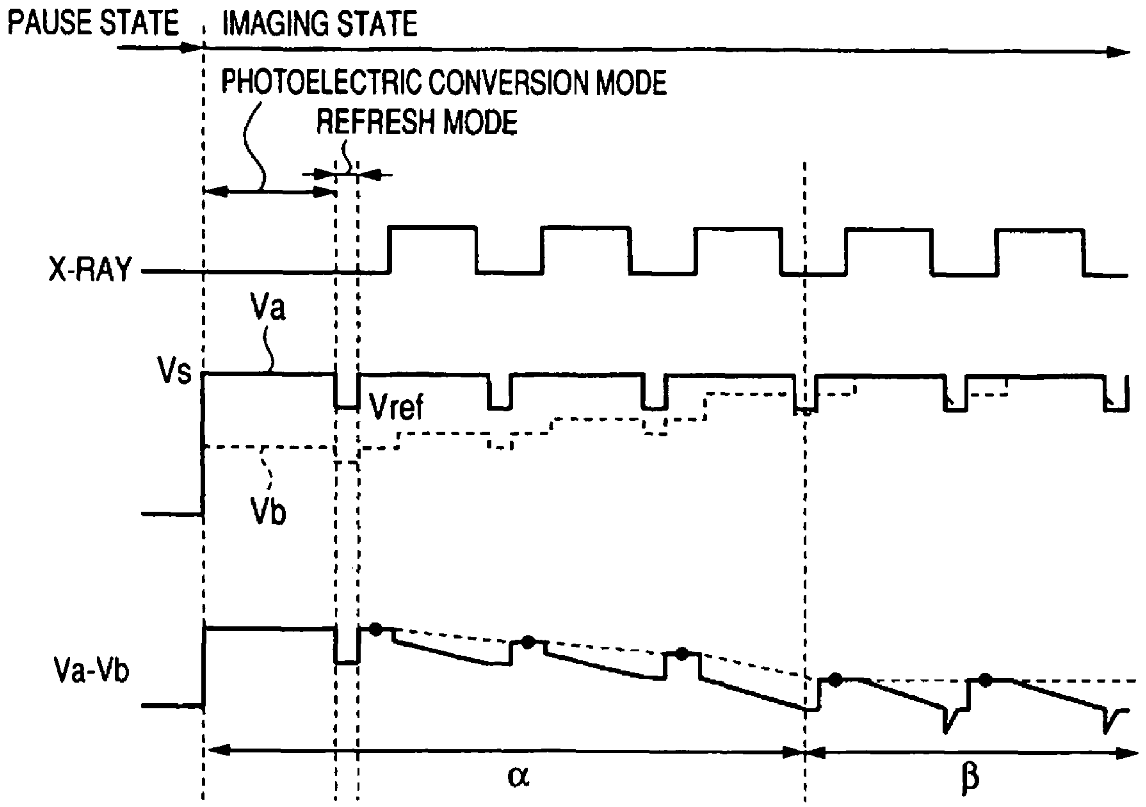
FIG. 4 is a timing chart showing changes of potentials of points A and B in the pixel shown in FIG. 3.

FIG. 4 is a timing chart showing changes of voltages of points A and B in the pixel shown in FIG. 3. FIG. 3 shows a voltage (Va-Vb) applied to the photoelectric conversion layer 209 together with potential Va of the point A and potential Vb of the point B when repeating irradiation with X ray and refresh from immediately after turning-on of a power supply. In the following description, operations of the TFT 216 are omitted. However, the TFT 216 is driven synchronously with refresh or read. Moreover, when a power supply is turned on, it is assumed that the TFT 216 is regularly turned on/off.

To change the operation halt state to the imaging possible state, supply of voltages is started from the sensor power supply 402, power supply Vcom, and power supply Vss. In this case, the potential Va becomes equal to the voltage Vs. However, the potential Vb is shown by the following Numerical Formula 1 when assuming the capacity of the photoelectric conversion layer 209 as Ci, the capacity of the insulating layer 208 as $C_{SIN}$, and the reference power supply of the amplifier 401 as Vr.

$$Vb = \frac{Ci}{Ci + C_{SIN}} \times (Vs - Vr) + Vr \quad \text{(Numerical Formula 1)}$$

The potential Vb rises due to accumulation of generated electric charges because when X ray is irradiated, the photoelectric effect occurs by the light of a phosphor for emitting light by receiving X ray. Moreover, in the refresh mode (state in which the voltage Vref is supplied to the sensor bias line 218), because the voltage Va is changed from Vs to Vref, the voltage Va lowers by a voltage ΔV shown by the following Numerical Formula 2.

$$\Delta V = \frac{Ci}{Ci + C_{SIN}} \times (Vs - Vref) \quad \text{(Numerical Formula 2)}$$

In the period a of Vv<Vref, because the band of the MIS-type photoelectric conversion element 217 has the band same as the case of photoelectric conversion mode, the MIS-type photoelectric conversion element 217 is not refreshed.

Thereafter, while irradiation of X ray is repeated, electric charges are accumulated on the interface between the photoelectric conversion layer 209 and the insulating layer 208 and the potential Vb rises. Then, in the period β in which Vb becomes equal to or larger than Vref at the time of refresh, refresh shows an effect. That is, the effect of refresh is first shown by making the state of the MIS-type photoelectric conversion element 217 approach to the saturation state.

Thus, in the period a, the voltage (Va-Vb) applied to the photoelectric conversion layer 209 is slowly lowered because electric charges generated by photoelectric effect are accumulated. Therefore, in the period a, the sensitivity of the MIS-type photoelectric conversion element 217 is slowly lowered whenever imaging is performed. Then, when imaging a plurality of sheets in the period a, a problem occurs that the contrast of an image is slowly lowered due to a change of sensitivities whenever imaging is performed or a problem occurs that sensitivities are changed between a sensor having much dose of light and a sensor having less dose of light and a problem occurs that uncomfortable feeling appears in an image in the last imaging. Moreover, when continuously imaging an image like the case of a dynamic image, the luminance of the whole image is slowly lowered from start of imaging. As a result, when there is the image uncomfortable feeling in an X-ray imaging apparatus used for diagnosis or operation, the diagnostic performance A is lowered or erroneous diagnosis occurs and the image uncomfortable feeling interrupts the operation by a spiritualist in the case in which an operation is performed by a see-through image.

However, in the period β, it is possible to keep the potential Vb before irradiation of X ray constant because refresh is effective. That is, it is possible to keep the voltage applied to the photoelectric conversion layer 209 constant by the refresh performed immediately before imaging and stabilize the sensitivity.

To decrease the period a in which sensitivity is fluctuated, a method for lowering the voltage Vref is used. By lowering the voltage Vref, the refresh quantity is increased and refresh is effective even when a small number of electric charges are accumulated. Therefore, it is possible to shorten the period a.

However, when lowering the voltage Vref, implantation quantity of electrons from the sensor bias line 218 to the photoelectric conversion layer 209 is increased in the refresh mode. Therefore, it is known that the dark current after refresh is increased or fluctuation of dark current characteristic every pixel is increased. Therefore, it is not a preferable method to lower the voltage Vref.

Moreover, a method for continuously applying a voltage to a pixel to keep the period β is considered. However, when always applying a voltage to the MIS-type photoelectric conversion element 217, deterioration of the characteristic is accelerated. Therefore, this is not preferable in view of the reliability of an apparatus. Actually, a conventional digital X-ray imaging apparatus restrains characteristic deterioration of the two-dimensional sensor 103 by stopping voltage supply to the sensor bias source 218, power supply Vcom, and power supply Vss when imaging is not performed and supplying no voltage to the two-dimensional sensor 103.

Thus, in the case of a digital X-ray imaging apparatus using a two-dimensional area sensor (sensor unit) having an MIS-type conversion element, it is difficult to restrain lowering of sensitivity by control or adjustment of a voltage to be applied to a two-dimensional sensor. The present inventor et al. find the above problem.

As a result of earnestly repeating study in order to solve the above problem in view of the above situation, the present inventor et al. reach the following various modes of the invention.

First Embodiment

Figure 5:
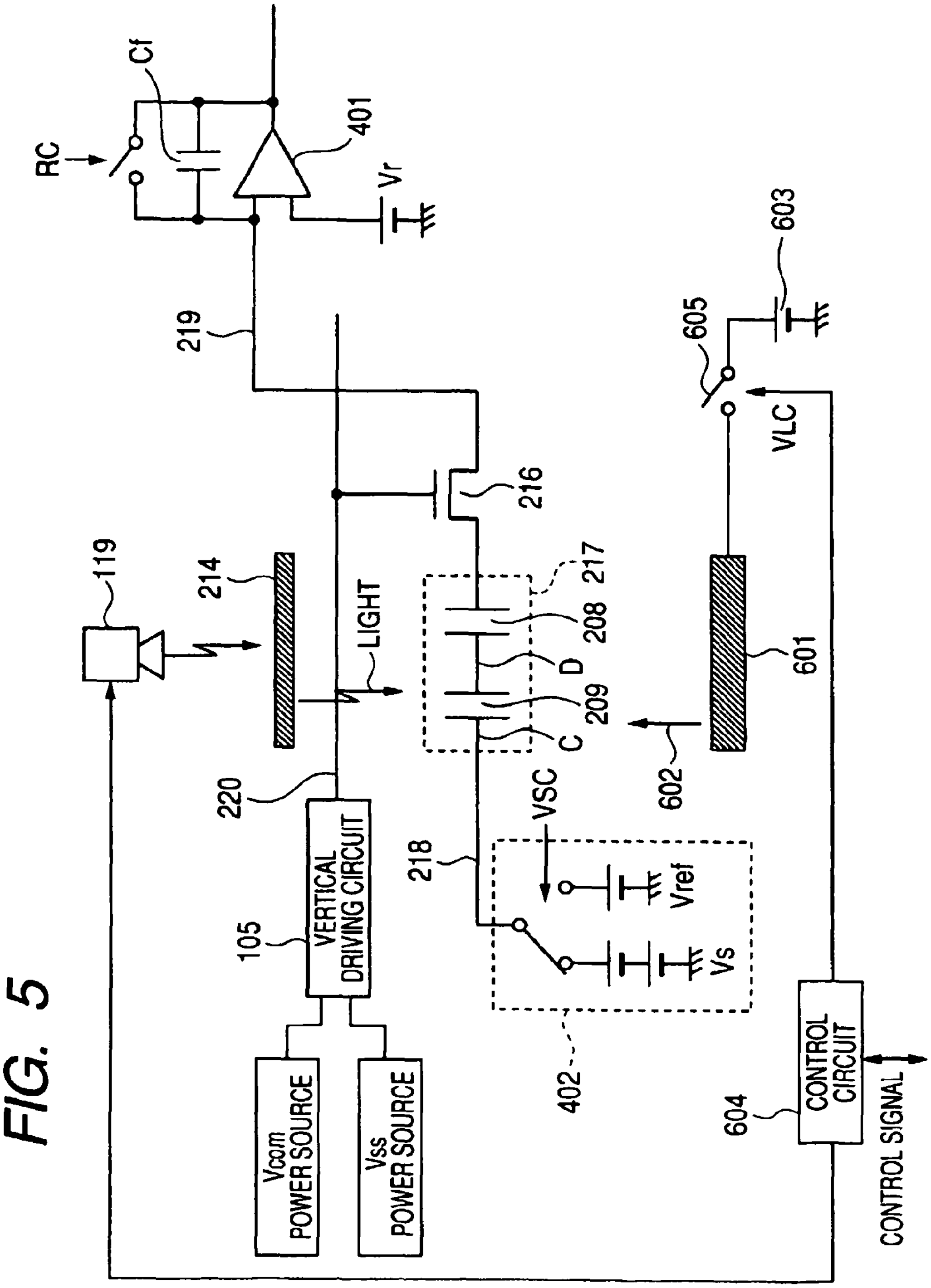
FIG. 5 is a circuit diagram showing the configuration of one pixel of a two-dimensional sensor of the radiation imaging apparatus (X-ray imaging apparatus) of first embodiment of the present invention.

First, first embodiment of the present invention is described below. FIG. 5 is a circuit diagram showing the configuration of one pixel of a two-dimensional sensor (sensor unit) in a radiation imaging apparatus (X-ray imaging apparatus) of the first embodiment of the present invention. In FIG. 5, a component provided with the same symbol as that in FIG. 1, 3 or the like is a device or circuit having the same function and its description is omitted.

This embodiment is provided with a light source 601, power supply 603 for making the light source 601 emit light, and switch 605 as means for bringing the MIS-type photoelectric conversion element 217 into a saturation state before performing X-ray imaging. As the light source 601, it is possible to use a light source capable of discharging the light having a wavelength which can be detected by the photoelectric conversion layer 209 serving as the conversion layer of an MIS-type conversion element at optional timing. For example, when an MIS-type photoelectric conversion element using amorphous silicon is used as an MIS-type conversion element, it is possible to use a device in which a plurality of LEDs or cold-cathode tubes are arranged, a device in which a light guide plate and a LED or cold-cathode tube are combined, or EL device. It is to be noted that the light having a wavelength which can be detected by the MIS-type photoelectric conversion element may includes also a radiation such as infrared rays and ultraviolet rays or the like other than the visible light.

Moreover, a control circuit 604 for controlling the light source 601 and an X-ray source 119 is provided. That is, the control circuit 604 can control light emission/no light emission of the light source 601 or control exposure of X ray from the X-ray source 119. For example, light irradiation by the light source 601 is controlled by the control circuit 604 so that the light is irradiated only for predetermined necessary time. In this case, it is preferable that the control circuit 604 sets the control circuit 604 so that it cannot expose the X-ray source 119 and X ray is not erroneously irradiated.

Figure 6:
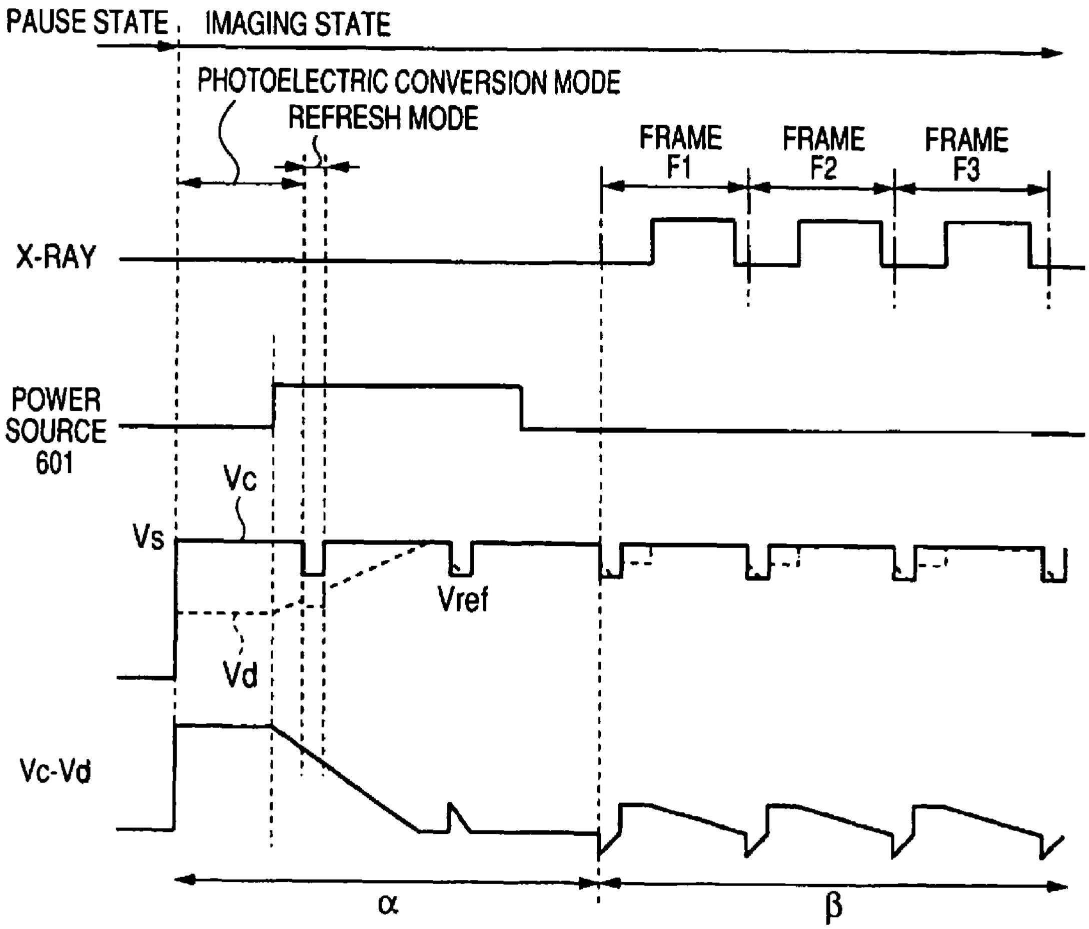
FIG. 6 is a timing chart showing changes of potentials of points C and D in the pixel shown in FIG. 5.

Then, operations of one pixel constituted as described are described by referring to FIG. 6. FIG. 6 is a timing chart showing changes of voltages of points C and D in the pixel shown in FIG. 5. FIG. 6 shows a voltage (Vc-Vd) applied to the photoelectric conversion layer 209 together with the potential Vc of the point C and the potential Vd of the point D when repeating X-ray irradiation and refresh from immediately after turning-on of a power supply.

First, the pause state in which no voltage is supplied to a two-dimensional sensor is changed to the imaging state for supplying a voltage to the MIS-type photoelectric conversion element 217 and TFT 216. In this state, as described above, the potential of the sensor bias line 218 becomes Vs and the voltage applied to the MIS-type photoelectric conversion element 217 is shown by Numerical Formula 1.

Under this state, light is irradiated from the light source 601 to the MIS-type photoelectric conversion element 217. As a result, electric charges are generated in the photoelectric conversion layer 209 and the voltage applied to the photoelectric conversion layer 209 is lowered.

Irradiation of light from the light source 601 in this case is performed until the MIS-type photoelectric conversion element 217 completely becomes a saturation state. Thereby, a constant voltage is always applied to the photoelectric conversion layer 209 by refresh operation and it is possible to restrain a change of sensitivities every imaging.

Then, when the MIS-type photoelectric conversion element 217 is saturated, light irradiation from the light source 601 is stopped and X-ray imaging is started.

It is preferable to adjust the quantity of light radiated from the light source 601 in view of the voltages Vs and Vref, capacity of photoelectric conversion layer 209 and the insulating layer 208, and utilization efficiency of light. Moreover, in the case of driving of a pixel, it is allowed to repeat refresh operation, accumulating operation, and read operation or repeat only the read operation. Moreover, at least one-time refresh operation is necessary from the time when light irradiation from the light source 601 is completed up to X-ray imaging. This is because a photoelectric conversion element is saturated when light irradiation by the light source 601 is completed, a sufficient image cannot be obtained when directly performing X-ray imaging.

Moreover, it is allowed to continue imaging interval as shown in FIG. 6 or not to continue the imaging interval. That is, as shown in FIG. 16C or 16D to be described later, when irradiating light in order to previously saturate a photoelectric conversion element, it is allowed to irradiate light intermittently (like pulse). Furthermore, it is allowed to perform imaging not irradiating X ray between X-ray imagings and correct an X-ray image imaged immediately before by using the image.

Moreover, after irradiation of sufficient light by the light source 601 is completed by a control signal of the control circuit 604, it is preferable to change a display for communicating that X ray can be exposed to a worker. Furthermore, when operations of a two-dimensional sensor are different before start of X-ray imaging and after start of X-ray imaging, it is allowed to change driving of the sensor in accordance with a signal of the control circuit 604.

It is allowed that the control circuit 604 is provided for a control computer 108 or program/control board 110 of a conventional X-ray imaging apparatus. Moreover, it is allowed to realize the function of the control circuit 604 by combining operations of the control computer 108 and program/control board 110.

Figure 7:
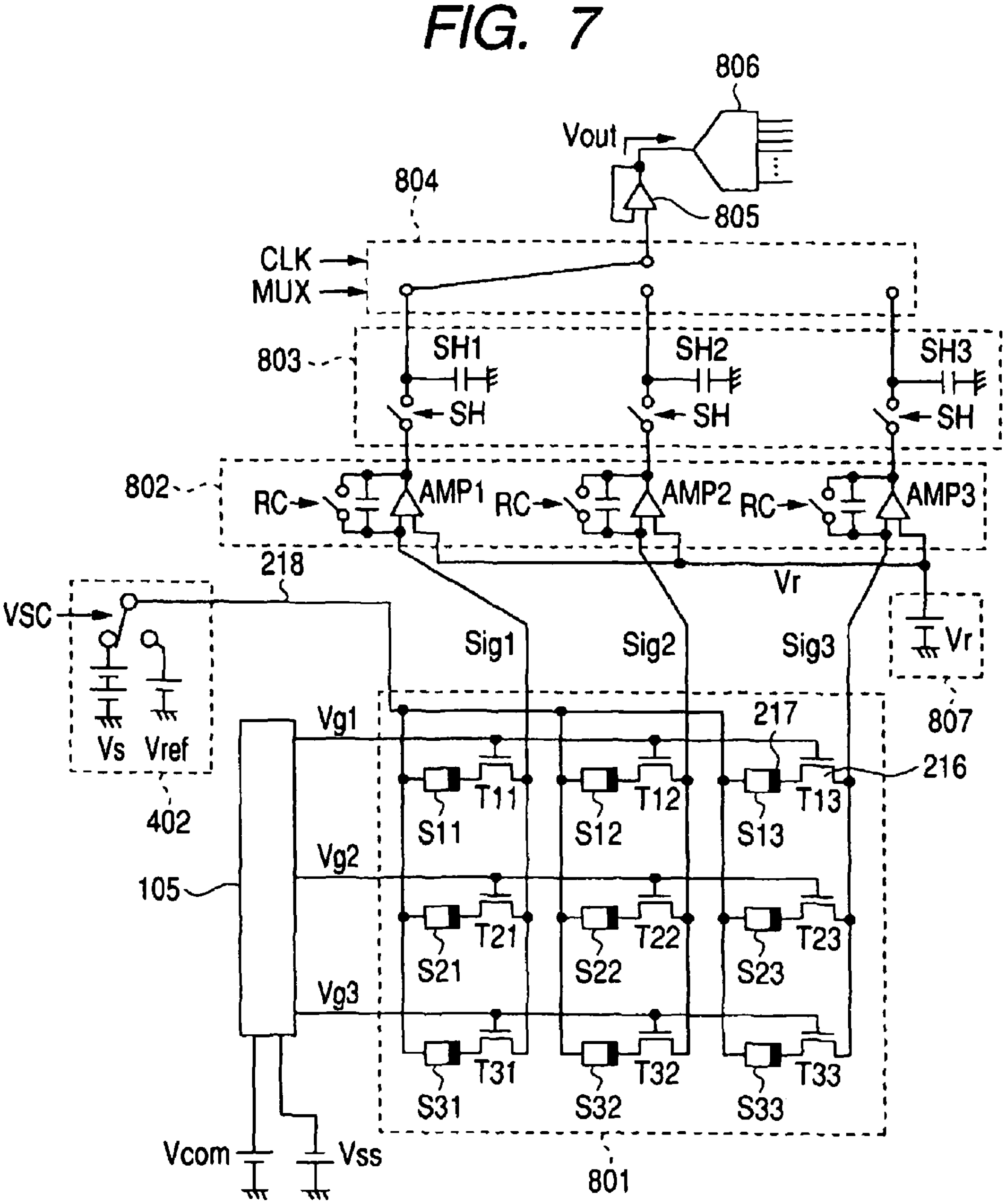
FIG. 7 is a circuit diagram showing the configuration of two-dimensional sensor in which nine pixels are arranged like a matrix.
Figure 8:
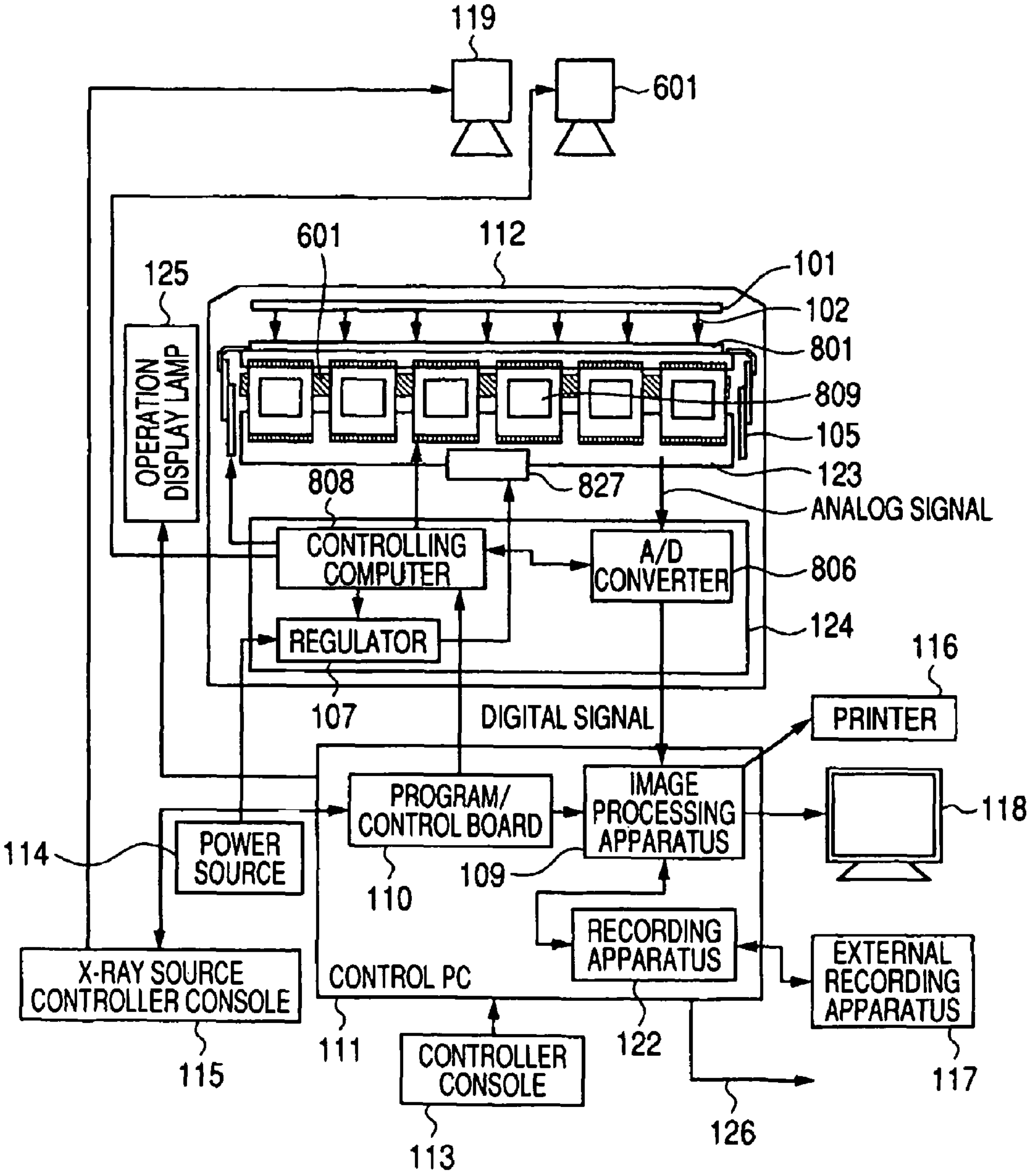
FIG. 8 is an illustration showing the configuration of an X-ray imaging apparatus using the two-dimensional sensor shown in FIG. 7.

Then, a two-dimensional sensor (sensor unit) having 9 above pixels (3×3 pixels) and its peripheral circuits are described below. FIG. 7 is a circuit diagram showing the configuration of a two-dimensional sensor in which nine pixels shown in FIG. 5 are arranged like a matrix and its peripheral circuits. Moreover, FIG. 8 is an illustration showing the configuration of an X-ray imaging apparatus using the two-dimensional sensor shown in FIG. 7.

The two-dimensional sensor (sensor unit) 801 shown in FIG. 7 is constituted when the MIS-type photoelectric conversion element 217 (S11-S33) and thin-film transistor (TFT) 216 (T11-T33) are arranged like a matrix of 3×3. The MIS-type photoelectric conversion element 217 (S11-S33) converts light emitted from a phosphor into an electrical signal. The thin-film transistor 216 (T11-T33) outputs electric charges accumulated in the MIS-type photoelectric conversion element 217 at optional timing. Though not shown in FIG. 7, a phosphor 101 is provided on the MIS-type photoelectric conversion element 217 as shown in FIG. 8. The phosphor 101 mainly contains $Gd_2O_2S$, $Gd_2O_3$ and/or CsI: T1.

The two-dimensional sensor 801 has amplifiers AMP1 to AMP3 respectively provided with a capacity Cf for accumulating electric charges output from the TFT 216 and connects with a signal amplifying circuit 802 for amplifying a signal. Signal lines Sig1 to Sig3 are set between the signal amplifying circuit 802 and the two-dimensional sensor 801. The signal lines Sig1 to Sig3 are connected to the drain electrode of the TFT 216. The signal amplifying circuit 802 connects with an Amp reference power supply 807 serving as the reference power supply of the amplifiers AMP1 to AMP3. Moreover, the signal amplifying circuit 802 connects with a sample-and-hold circuit 803 for holding output voltage of the signal amplifying circuit 802 for an optional period and multiplexer 804 for serially outputting signals held by the sample-and-hold circuit 803. The sample-and-hold circuit 803 holds an electrical signal output from the signal amplifying circuit 802 until the circuit 802 is selected by the multiplexer 804. Moreover, the signal amplifying circuit 802 connects with a buffer amplifier 805 for outputting the output of the multiplexer 804 at a low impedance and A/D converter 806 for converting an analog signal into a digital signal. The signal amplifying circuit 802, sample-and-hold circuit 803, multiplexer 804, and buffer amplifier 805 are included in a signal processing circuit 809.

Moreover, the two-dimensional sensor 801 connects with a power supply Vs necessary for photoelectric conversion and sensor power supply 402 provided with the power supply Vref for setting the MIS-type photoelectric conversion element 217 to a refresh mode. The sensor bias line 218 is connected between the N+ amorphous silicon layer of the MIS-type photoelectric conversion element 217 and the sensor power supply 402. The sensor power supply 402 and Amp reference power supply 807 are included in a low-noise power supply 827.

Moreover, a vertical driving circuit 105 for driving gate lines Vg1 to Vg3 connected to the gate electrode of the TFT 216 of the two-dimensional sensor 801 is provided. The vertical driving circuit 105 connects with the power supply Vcom for turning on the TFT 216 and power supply Vss for turning off the TFT 216. The vertical driving circuit 105 sequentially supplies a voltage pulse constituted of voltages Vcom and Vss to three gate lines Vg1 to Vg3 by optional time.

Signal lines Sig1 to Sig3 and sensor bias line 218 are shared by top and bottom pixels and gate lines Vg1 to Vg3 are shared by right and left pixels. Moreover, it is assumed that the control circuit 604 in FIG. 6 is included in the control computer 808.

A control panel 124, the phosphor 101, a two-dimensional sensor (sensor unit) 103, and the light source 601 are arranged within an envelope 112 of a flat panel detector.

Figure 9:
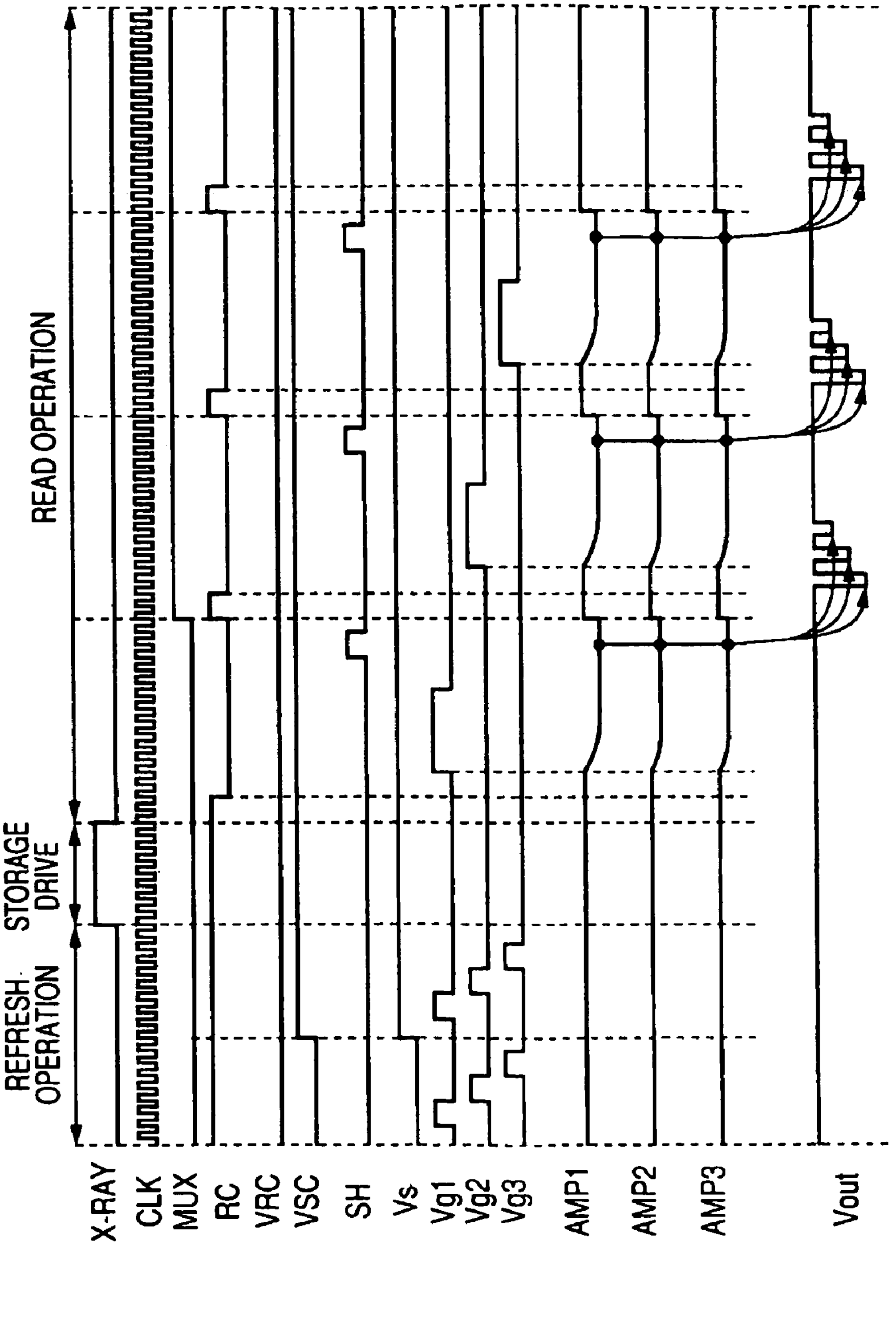
FIG. 9 is a timing chart showing operations of the two-dimensional sensor 801 of the first embodiment.
Figure 10:
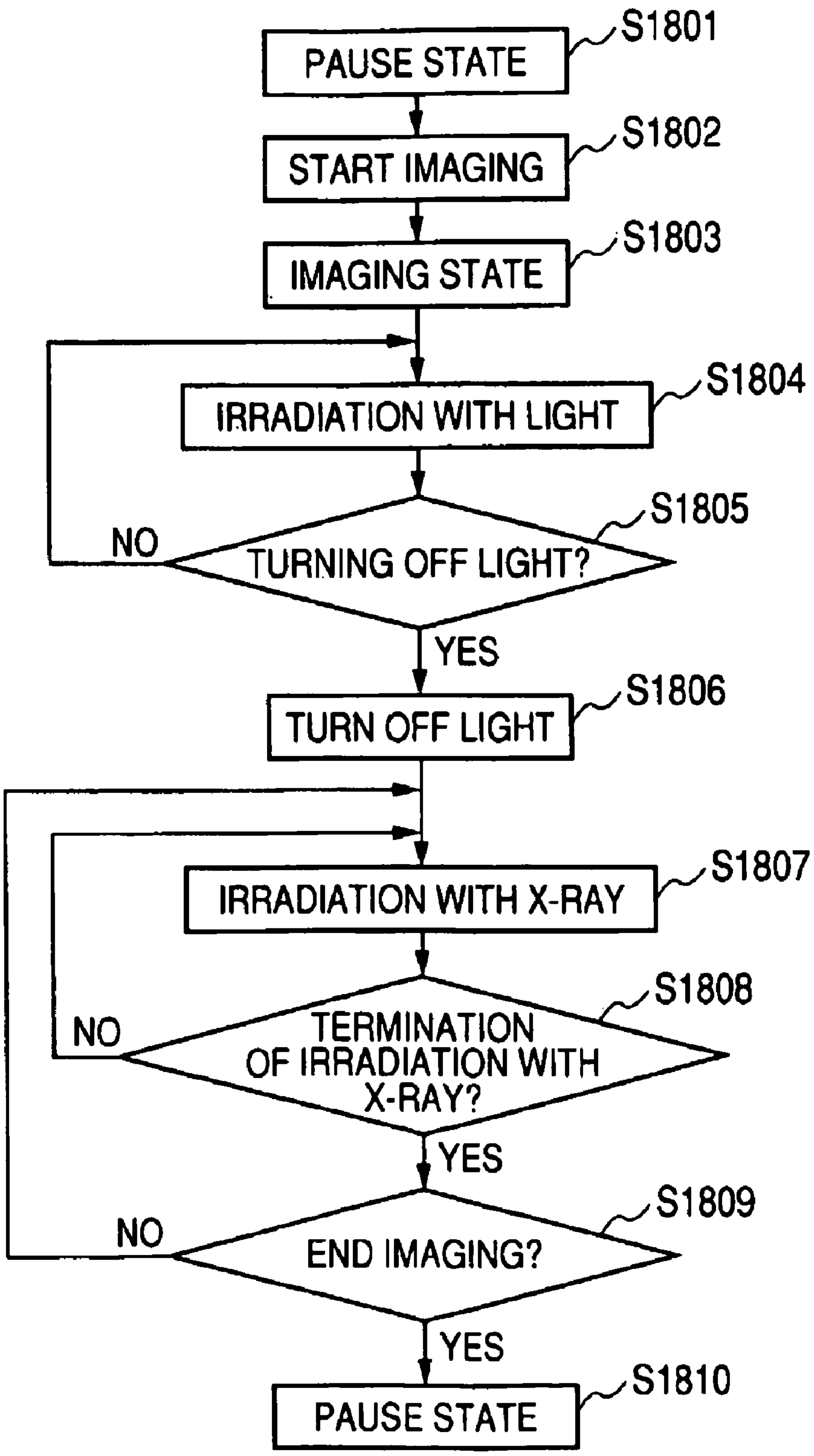
FIG. 10 is a flowchart showing the driving method of the two-dimensional sensor 801 of the first embodiment.
Figure 11:
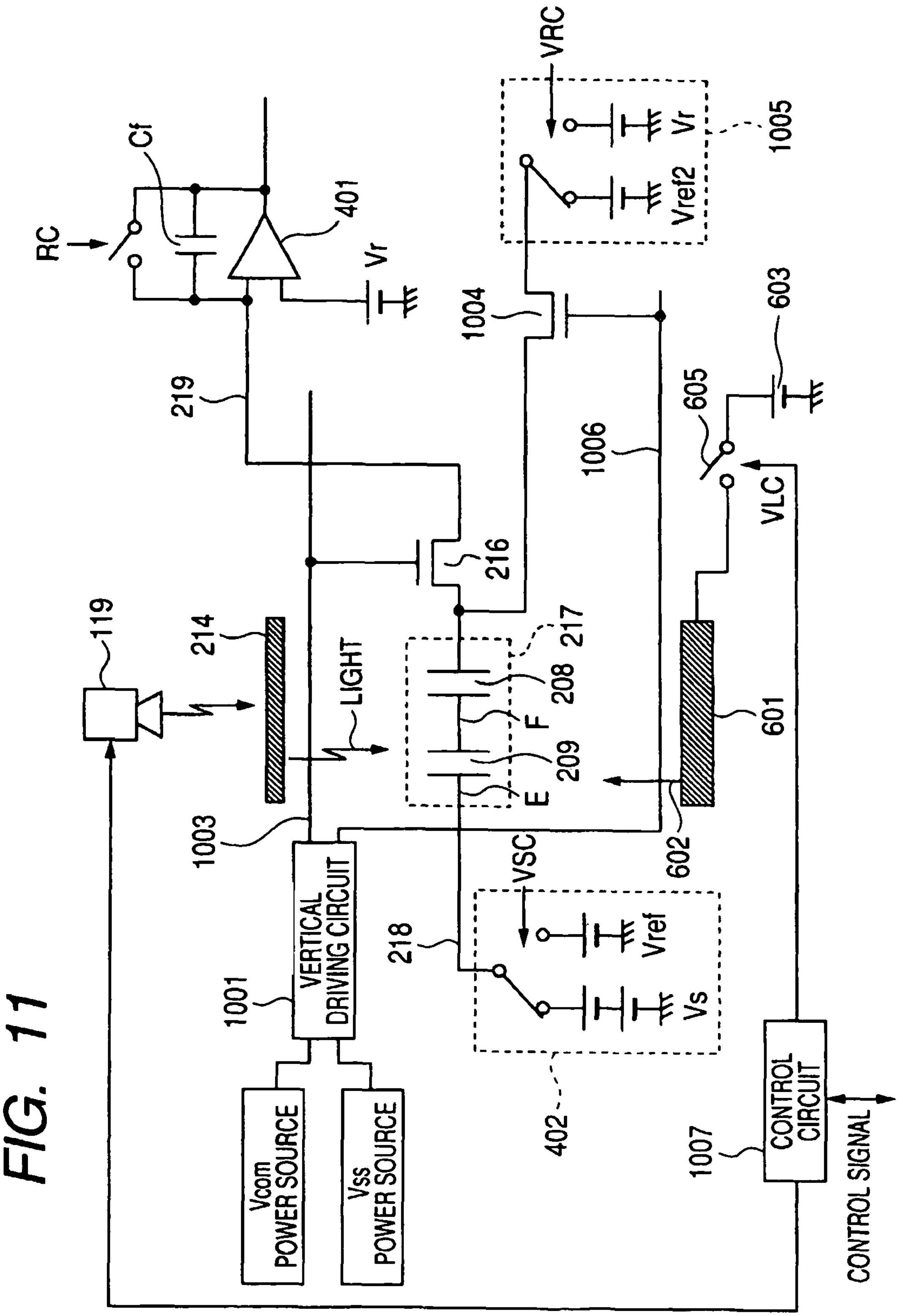
FIG. 11 is a circuit diagram showing the configuration of one pixel of a two-dimensional sensor of the radiation imaging apparatus (X-ray imaging apparatus) of second embodiment of the present invention.

Then, driving methods and operations of the two-dimensional sensor 801 constituted as described above and its peripheral circuits are described by referring to FIGS. 10 and 11. FIG. 9 is a timing chart showing operations of the two-dimensional sensor 801 of the first embodiment and FIG. 10 is a flowchart showing the driving method of the two-dimensional sensor 801 of the first embodiment.

Before imaging is started, an X-ray imaging apparatus is kept in a pause state (step S1801). In this case, the pause state represents a state in which no voltage is applied to the MIS-type photoelectric conversion element 217 and TFT 216 in the two-dimensional sensor 801. By keeping this state, it is possible to keep service lives of the TFT 216 and MIS-type photoelectric conversion element 217 which are easily deteriorated due to long-time application of voltage long. Moreover, in the pause state, it is preferable to cut off supply of power to the signal processing circuit 809 such as the signal amplifying circuit 802 except a necessary portion to save power.

Then, when an operator starts imaging by performing a necessary procedure (step S1802), a predetermined voltage is applied to the two-dimensional sensor 801, the voltage Vs is applied to the MIS-type photoelectric conversion element 217 and the voltage Vss is applied to the gate lines Vg1 to Vg3. Moreover, a voltage necessary for the Amp reference power supply and driving is also applied to the signal amplifying circuit 802 and an operation state is started (step S1803).

After starting the imaging state, light is irradiated from the light source 601 iww the control by control circuit 604 (control computer 808) (step S1804). The output of the two-dimensional sensor 801 is sent to the control computer 808 after the output is converted into digital data and necessary processing is applied. The control circuit 604 determines whether to realize a saturation state or stop irradiation of light in accordance with the data (step S1805). However, while light is irradiated, as shown in FIG. 6, refresh operation, photoelectric conversion operation, and read are repeated.

For control of irradiation and stop of light, it is allowed to stop irradiation after performing the irradiation only by a preset time, for example. In this case, the time for irradiating light can be programmed in the control computer 808. Then, it is allowed to set the irradiation time when the two-dimensional sensor 801 is fabricated or at the time of setting after fabrication. Moreover, it is allowed to monitor the output fluctuation from the MIS-type photoelectric conversion element 217 at the time of light irradiation and determine light irradiation stop time.

Then, when the control computer 808 determines stopping of irradiation of light, it stops irradiation in step S1806.

Then, the two-dimensional sensor 801 also starts the operation for imaging by an operator when X-ray irradiation is started (step S1807).

In this case, the operation for imaging a static image is described below. Moreover, as shown in FIG. 9, it is assumed to obtain a static image by three operations of refresh operation, accumulation operation, and read operation of the MIS-type photoelectric conversion element 217.

To obtain a static image, the MIS-type photoelectric conversion element 217 is first refreshed by using the sensor power supply 402. In this case, the MIS-type photoelectric conversion element 217 is refreshed by using the sensor power supply 402 in order to secure a large dynamic range necessary for a static image.

In this refresh operation, the control signal VSC is first set to low (Lo) to supply the voltage Vref optimum for refresh to the sensor bias line 218. However, in this case, because the potential of the sensor bias line 218 side of MIS-type photoelectric conversion element 217 and the potential of a sensor bottom electrode layer 207 simultaneously rise, the refresh mode is not realized.

To realize the refresh mode, the voltage Vcom is further supplied to the gate lines Vg1 to Vg3 by the vertical driving circuit 105 to turn on the TFT 216 and equalize the potential of the sensor bottom electrode layer 207 with potentials of the signal lines Sig1 to Sig3. In this case, the control signal RC of the amplifiers AMP1 to AMP3 is set to high (Hi) to set potentials of the signal lines Sig1 to S1g3 to the reference potential Vr.

In the case of the timing chart shown in FIG. 9, the TFT 216 for each pixel is turned on for each line. However, it is also allowed to simultaneously turn on all TFTs 216.

Then, after setting all pixels to the refresh mode, the voltage Vs suitable for the photoelectric conversion mode is output to the two-dimensional sensor 801 by turning off the TFTs 216 and setting the control signal VSC of the sensor power supply 402 high (Hi).

In this case, the MIS-type photoelectric conversion element 217 is not change to the photoelectric conversion mode only by changing the voltage applied to the sensor bias line 218 like the case of refresh operation. Therefore, the TFTs 216 are turned on by the vertical driving circuit 105. The refresh operation is completed by setting all pixels to the photoelectric conversion mode.

After completing the refresh operation, accumulation operation is started. When the two-dimensional sensor 801 starts the accumulation operation, it is communicated to an operator that X ray can be exposed. This information can be performed through, for example, a control console 113, operation indicator lamp 125, or monitor 118.

Then, when an X-ray exposure switch set to an X-ray control console 115 is pushed by an operator, exposure of X ray is started by the X-ray power supply 119 and X ray is irradiated by necessary time in accordance with a portion to be imaged or dose. The program/control board 110 controls the dose and completes irradiation of X ray at the stage of a proper dose (step S1808).

The read operation for transferring electric charges having the information on human bodies accumulated in the MIS-type photoelectric conversion element 217 is started simultaneously with completion of X-ray imaging. The read operation is constituted of two operations such as the reset operation which is a preparing operation for transferring electric charges accumulated in the MIS-type photoelectric conversion element 217 and the signal transferring operation for transferring electric charges accumulated in the MIS-type photoelectric conversion element 217 to the signal amplifying circuit 802.

First, the control signal RC is set to high (Hi) to reset all capacities Cf of the signal amplifying circuit 802. By setting the signal amplifying circuit 802 and signal lines Sig1 to Sig3 to a state suited to transfer a signal by the reset operation, it is prevented that a signal not related to the information on human bodies to be accumulated in the capacity Cf at the time of accumulating operation is read. Moreover, though potentials of the signal lines Sig1 to Sig3 are unstable due to the influence of potential fluctuations of the gate lines Vg1 to Vg3, the potentials are reset to the reference voltage Vrf of the Amp reference power supply 807 and stabilized by the reset operation. Then, after performing resetting for sufficient time, the control signal RC is set to low (Lo) to complete resetting.

Then, the signal transferring operation is performed. In the case of the signal transferring operation for transferring electric charges accumulated in the MIS-type photoelectric conversion element 217, voltages of the gate lines Vg1 to Vg3 are sequentially changed from the voltage Vss to voltage Vcom by the vertical driving circuit 105 to turn on the TFT 216. When the TFT is turned on, electric charges accumulated in the MIS-type photoelectric conversion element 217 are transferred to capacities Cf of the signal amplifying circuit 802. For example, when the voltage of the gate line Vg1 becomes the voltage Vcom, TFT T11 to TFT T13 are turned on and electric charges accumulated in the MIS-type photoelectric conversion elements S11 to S13 are transferred to amplifiers AMP1 to AMP3.

Then, after turning on the TFT 216 until electric charges are sufficiently transferred, the voltage to be applied to the gate lines Vg1 to Vg3 is changed to the voltage Vss to turn off the TFT 216 and complete transfer of signals. It is only necessary to set the time for keeping the TFT 216 turned-on by considering the capacitance of the MIS-type photoelectric conversion element 217, the ON characteristic of the TFT 216 and the voltage Vcom.

After transferring signals to the signal amplifying circuit 802, the control signal SH of the sample-and-hold circuit 803 is set to high (Hi) to transfer outputs of the amplifiers Amp1 to Amp3 connected to sample-and-hold capacities SH1 to SH3 to sample-and-hold capacities SH1 to SH3. The control signal SH is kept high (Hi) until voltages output from the amplifiers Amp1 to Amp3 are sufficiently transferred to sample-and-hold capacities and after transfer is completed, the voltages are set to low (Lo).

Electrical signals transferred to the sample-and-hold capacities SH1 to SH3 are read by the multiplexer 804 in time series during the signal transferring period of the next line (lower line) as shown in FIG. 10.

By applying these transferring operations to all lines, it is possible to transfer electrical signals accumulated in all pixels.

After transferring the electrical signals, operation is changed in accordance with whether to complete imaging (step S1809). When completing imaging (a case in which X-ray irradiation is not performed for long time is also included), the two-dimensional sensor 801 is brought to pause state in order to prevent characteristic deterioration of the MIS-type photoelectric conversion element 217 and TFT 216 (step S1809). When moving to the pause state, irradiation of light by the light source 601 is necessary before X-ray irradiation by all means.

However, when X-ray irradiation is resumed, a state in which X-ray irradiation is possible is directly realized because a state in which the refresh operation is effective is maintained (step S1807).

Thus, it is enough to perform irradiation of light only when the two-dimensional sensor 801 is changed from the pause state to the imaging state but it is not necessary to perform irradiation of light whenever X-ray irradiation is performed. Moreover, it is allowed to change whether to move to a pause state after completion of irradiation with X ray or transfer of electric charges to judgment of an operator or make a program so that when the time previously set by a timer elapses, the pause state is started. Furthermore, it is preferable to display whether the two-dimensional sensor 801 is set to the pause state or imaging state on the monitor 118 so that an operator can always confirm the state.

According to the operation, it is possible to stably acquire a static image having a preferable image quality without lowering sensitivity.

It is preferable that the operation timing and voltage of the above embodiment use proper values in accordance with the withstand voltage or characteristic of the TFT 216 and MIS-type photoelectric conversion element 217. Moreover, it is allowed to perform the read operation so that the multiplexer 804 is not operated after refresh operation. By performing this operation, it is possible to exclude a dark current generated immediately after the refresh operation from an image signal and improve the image quality. Though FIG. 7 shows the two-dimensional sensor 801 of 3×3 pixels, it is preferable that more pixels are used.

Furthermore, it is allowed to perform the accumulation operation between the refresh operation and the read operation while light is irradiated. Furthermore, though details will be described later, it is allowed to restrict irradiation of light only to the time of accumulation operation as shown in FIG. 15C.

Furthermore, though imaging of a static image is described above, it is also possible to image a dynamic image by using the X-ray imaging apparatus of the first embodiment. In this case, it is preferable to set operation timing and voltage in accordance with the number of frames necessary for dynamic-image imaging.

Second Embodiment

Then, second embodiment of the present invention is described below. FIG. 11 is a circuit diagram showing the configuration of one pixel of the two-dimensional sensor of the radiation imaging apparatus (X-ray imaging apparatus) of the second embodiment of the present invention.

To image a dynamic image, it is necessary that a photoelectric conversion element always keeps stable sensitivity and dynamic range. Therefore, it is preferable to refresh pixels every frame. However, in the case of the structure of the first embodiment, refresh can be simultaneously performed only for all pixels. Therefore, a frame rate is lowered by the time of the refresh operation.

However, in the case of the second embodiment, a TFT 1004 for refresh is set every pixel. The gate of the TFT 1004 for refresh is connected to a gate line 1006 connected to a vertical driving circuit 1001. Moreover, the source of the TFT 1004 for refresh is connected to the source of the TFT 216 and a refresh power supply 1005 is connected to the drain of the TFT 1004 for refresh. The refresh power supply 1005 can supply voltages Vref2 and Vr. In this case, the voltage Vr is the same voltage as that of the reference power supply Vr of the amplifier 401. Moreover, voltage Vref2 is higher than that of the reference power supply Vr of the amplifier 401 and lower than the voltage Vs.

Furthermore, the second embodiment is provided with a control circuit 1007 for controlling the light source 601 and X-ray source 119 similarly to the case of the control circuit 604 of the first embodiment. The control circuit 1007 controls light emitting/no-light emitting of the light source 601 and exposure of X ray from the X-ray source 119.

By using the above configuration, the second embodiment performs refresh by using the TFT 1004 for refresh instead of changing voltages applied from the sensor bias line 218 and thereby refreshing the MIS-type photoelectric conversion element 217.

When performing refresh by the circuit shown in FIG. 11, the voltage Vcom is first supplied to the gate line 1006 to turn on the TFT 1004 for refresh. In this case, the control signal VRC is controlled so as to output the voltage Vref2 from the refresh power supply 1005. As a result, the voltage Vref2 is supplied to the sensor bottom electrode layer 207 of the MIS-type photoelectric conversion element 217 through the TFT 1004 for refresh, the potential of the sensor bottom electrode layer 207 is lowered, and the band state same as the case of the refresh mode shown in FIG. 2C is realized.

Then, after supplying the voltage Vref2 sufficient for refresh, the control signal VRC is controlled to supply the voltage Vr to the TFT 1004 for refresh from the refresh power supply 1005. As a result, when the voltage Vr is applied to the sensor bottom electrode layer 207 of the MIS-type photoelectric conversion element 217 through the TFT 1004 for refresh, the MIS-type photoelectric conversion element 217 becomes the photoelectric conversion mode.

Thereafter, by applying the voltage Vss to the gate line 1006 and turning off the TFT 1004 for refresh, refresh operation is completed.

By performing this refresh operation, it is possible that each pixel can independently perform refresh and a pixel can be refreshed when other line is read.

Figure 12:
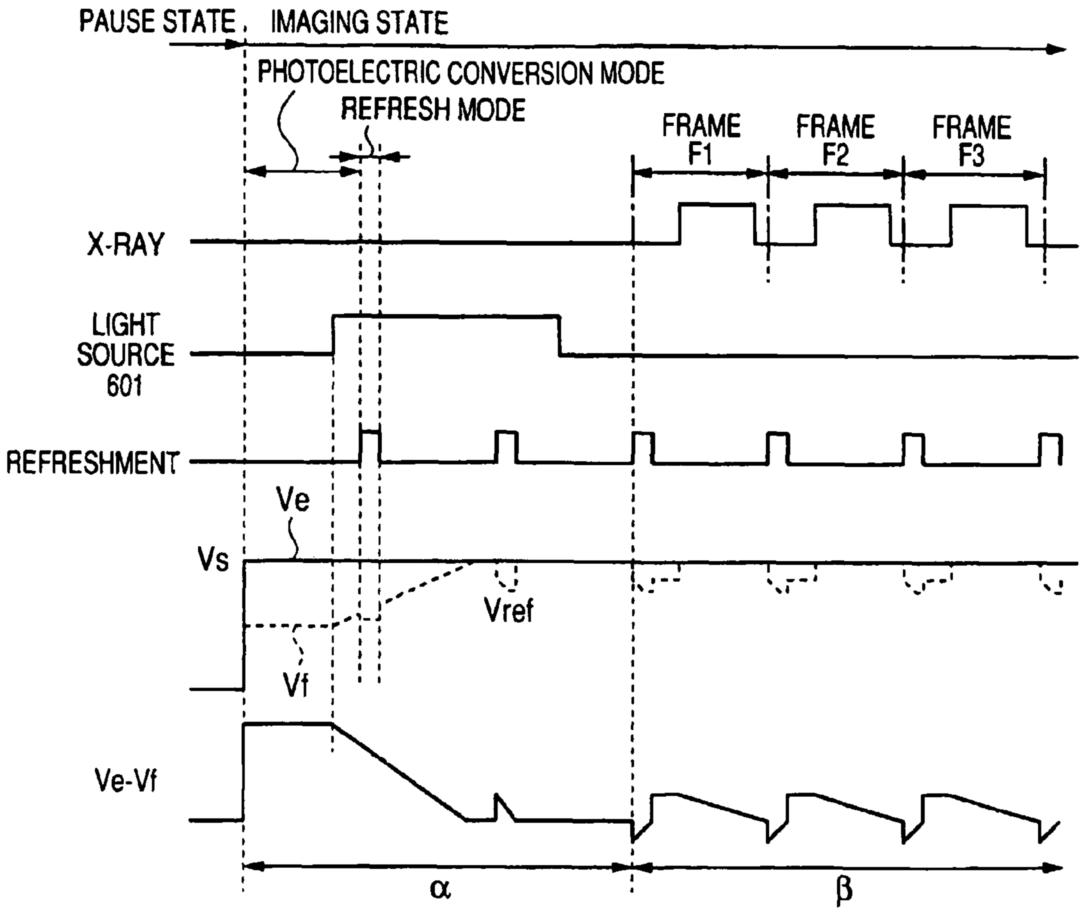
FIG. 12 is a timing chart showing changes of potentials of points E and F in the pixel shown in FIG. 11.
Figure 13:
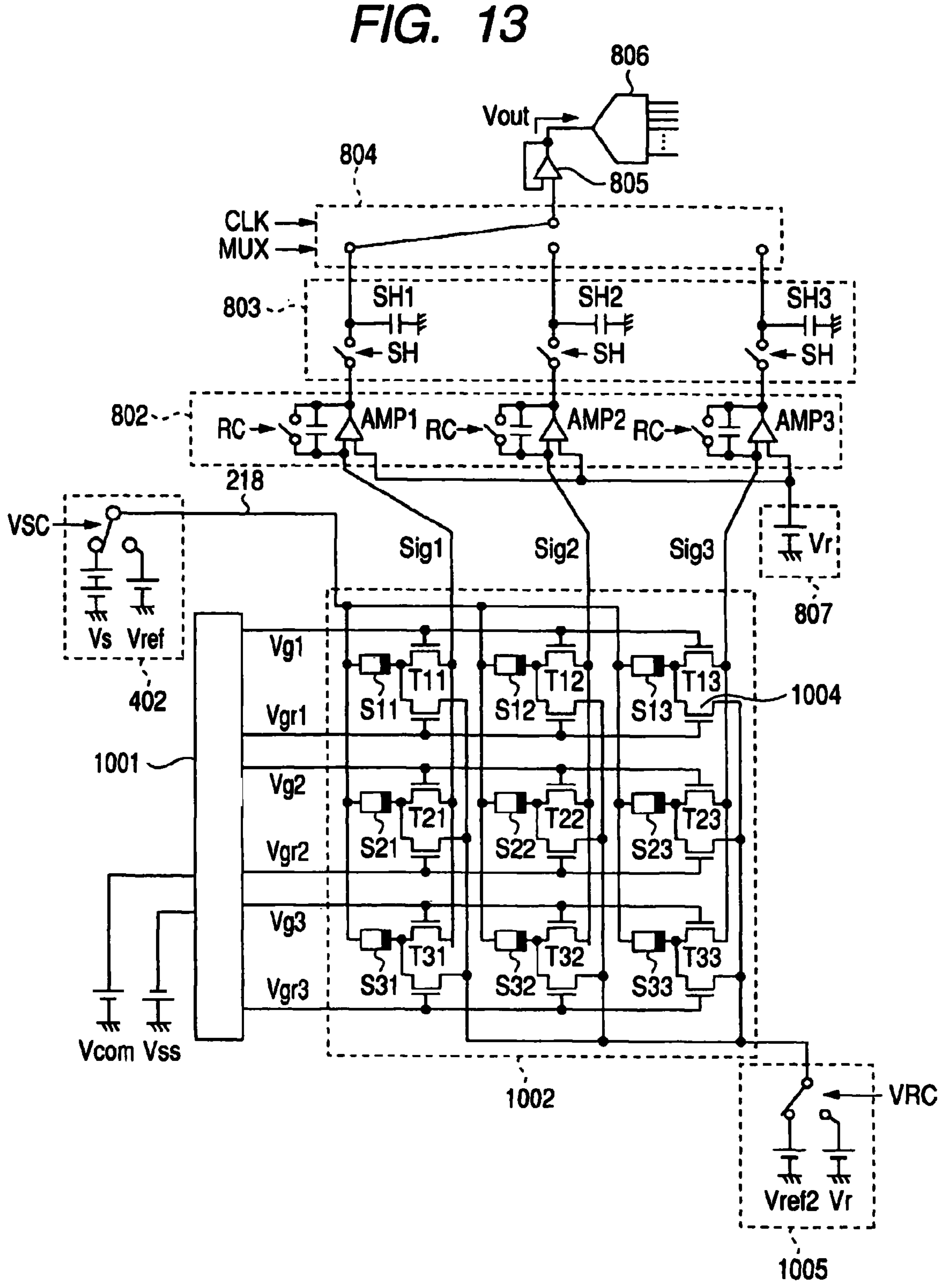
FIG. 13 is a circuit diagram showing the configuration of a two-dimensional sensor in which nine pixels shown in FIG. 11 are arranged like a matrix and its peripheral circuits.

Then, operations of one pixel constituted as described above are described by referring to FIG. 13. FIG. 12 is a timing chart showing changes of potentials of the points E and F in the pixel shown in FIG. 13. FIG. 13 shows the voltage (Ve-Vf) to be applied to the photoelectric conversion layer 209 together with the potential Ve of the point E and potential Vf of the point F when X-ray irradiation and refresh are repeated from immediately after a power supply is turned on.

The portion rising in "refresh" in FIG. 13 shows that the MIS-type photoelectric conversion element 217 is refreshed. Refresh in this embodiment is performed by turning on the TFT 1004 for refresh and changing voltages at the bottom electrode layer 207 side of the MIS-type photoelectric conversion element 217 as described above. Therefore, the timing of refresh is changed by the potential of the point F. The change of voltages of other portion is the same as the case of the first embodiment shown in FIG. 6. That is, also in the case of this embodiment, the principle of irradiating light from the light source 601 before performing imaging to restrain the fluctuation of sensitivity and setting the MIS-type photoelectric conversion element 217 to saturation state is the same as the case of the first embodiment.

Then, a two-dimensional sensor (sensor unit) provided with nine above pixels (3×3 pixels) and its peripheral circuits are described. FIG. 13 is a circuit diagram showing the configuration of a two-dimensional sensor in which nine pixels shown in FIG. 11 are arranged like a matrix and its peripheral circuits.

In the case of the second embodiment, the TFT 1004 for refresh is set to each pixel and the two-dimensional sensor (sensor unit) 1002 is constituted compared to the first embodiment shown in FIG. 7. Moreover, the refresh power supply 1005 is added. Furthermore, not only three gate lines Vg1 to Vg3 but also the vertical driving circuit 1001 for driving the gate lines Vgr1 to Vgr3 (1006) are set instead of the vertical driving circuit 105. That is, the vertical driving circuit 1001 is constituted so as to be able to separately drive the gate lines Vg1 to Vg3 for driving the TFT 216 for transfer and the gate lines Vgr1 to Vgr3 for controlling the TFT 1004 for refresh. Moreover, a refresh line for connecting the refresh power supply 1005 and TFT 1004 for refresh of each pixel is set. Other configuration is the same as the case of the first embodiment.

Figure 14:
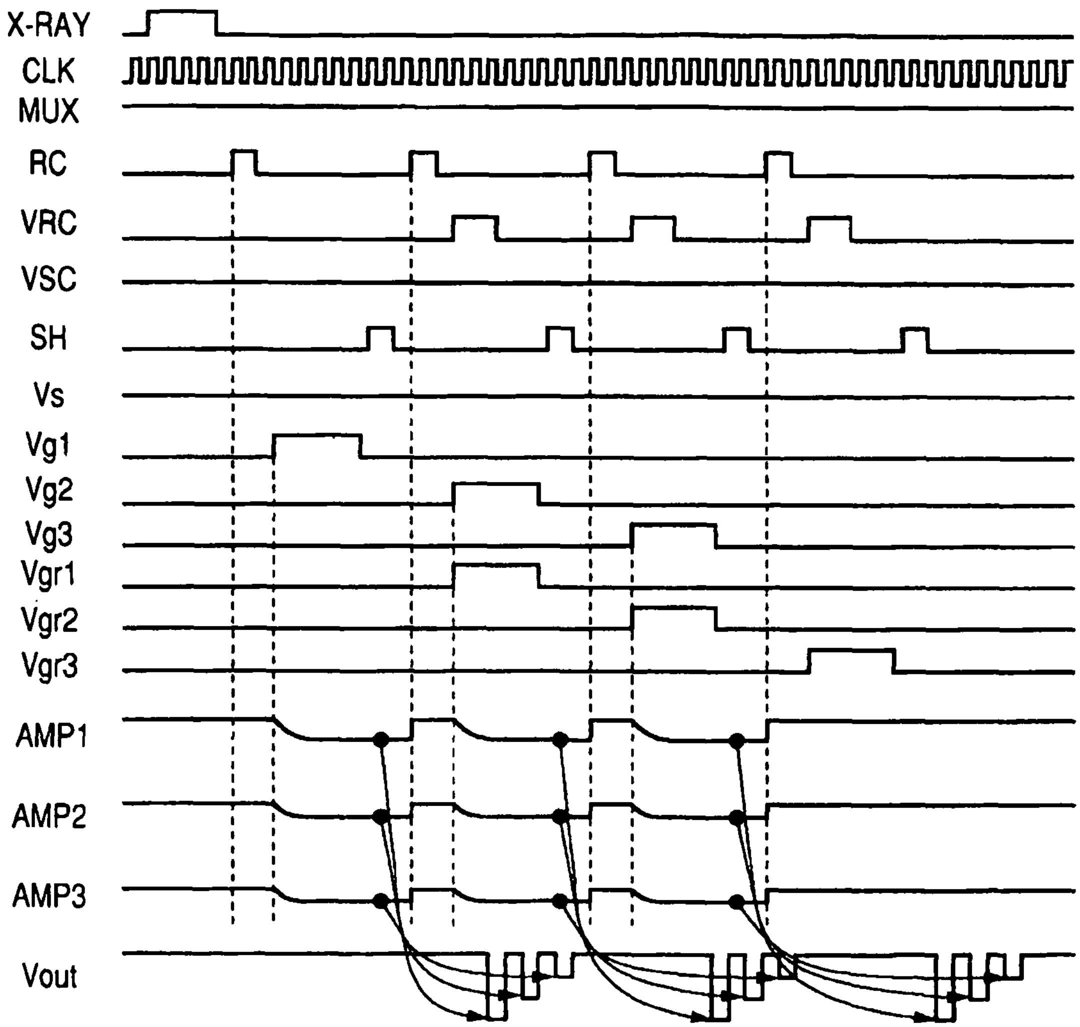
FIG. 14 is a timing chart showing operations of a two-dimensional sensor 1002 of the second embodiment.

Then, the two-dimensional sensor 1002 constituted as described above and driving method and operations of its peripheral circuits are described by referring to FIG. 14. FIG. 14 is a timing chart showing operations of the two-dimensional sensor 1002 of the second embodiment.

First, by irradiating light from the light source 601 similarly to the case of the first embodiment, each pixel is set to saturation state. Thereafter, the two-dimensional sensor 1002 also starts the operation for imaging when X-ray irradiation is started by an operator.

The operation for imaging a dynamic image is described below.

First, the TFTs 216 for all pixels are turned off to irradiate X ray while setting the MIS-type photoelectric conversion element 217 to the photoelectric conversion mode. As a result, electric charges proportional to the quantity of light emitted from a phosphor are accumulated in the MIS-type photoelectric conversion element 217 by receiving X ray passing through an object and reaching the phosphor.

Then, the electric charges accumulated in the MIS-type photoelectric conversion element 217 are read from the two-dimensional sensor 1002. First, the control signal RC is set to high (Hi) to reset outputs of the AMP1 to AMP3 connected to the signal lines Sig1 to Sig3. Thereby, it is possible to remove electric charges accumulated in the integral capacity Cf which become causes of noise and offset. Then, the amplifiers AMP1 to AMP3 are reset for sufficient time and then the control signal RC is set to low (Lo) to complete the reset operation.

Then, the voltage Vcom is supplied to the gate line Vg1 to turn on TFTs T11 to T13. When these TFTs are turned on, electric charges accumulated in the MIS-type photoelectric conversion elements S11, S12, and S13 are transferred to the amplifiers MP1 to AMP3 through the signal lines Sig1 to Sig3. Then, TFTs T11 to T13 are turned on by the time sufficient for transfer of electric charges and these TFTs T11 to T13 are turned off. Moreover, after proper time elapses after the TFTs T11 to T13 are turned off, the control signal SH is set to high (Hi) to make the sample-and-hold circuit 803 hold outputs of the amplifiers AMP1 to AMP3.

Thus, the read operation for one line is performed.

Electric charges sample-held by the sample-and-hold circuit 803 are serially transferred to the A/D converter 806 by the multiplexer 804 through the buffer amplifier 805 when reading the next line.

Then, read pixels are refreshed when reading the next line. This refresh operation is described above. However, as shown in FIG. 14, because the gate lines Vgr1 to Vgr3 of the TFT 1004 for refresh of pixels are shared by right and left pixels, refresh is performed one horizontal line by one horizontal line.

By performing the above read operation and refresh operation for all lines, electric-charge transfer and refresh of all pixels are completed. Moreover, it is possible to image a dynamic image by repeating the driving in FIG. 15. That is, because the read operation and refresh operation required to image a dynamic image can be continuously performed every one horizontal line, it is possible to improve a frame rate.

It is not always necessary to make the timing for turning on/off the TFT 1004 for refresh coincide with turn-on/off of the TFT 216 for transfer at the next line. Moreover, it is preferable to select each power supply voltage so as to satisfy characteristics of the MIS-type photoelectric conversion element 217 and TFT 216, transfer capacity requested as an imaging apparatus, and dark current.

Moreover, in the above description of operations, imaging of a dynamic image is described. However, it is also possible to image a static image by using the X-ray imaging apparatus of the second embodiment. In this case, it is only necessary to use the TFT 1004 for refresh by turning it off. Therefore, it is also possible to image a static image after imaging a dynamic image. This sequence is a sequence to be generally performed at the time of see-through imaging of a digestive system. In this case, it is only necessary to image a dynamic image (see-through) along the timing chart in FIG. 14 and when imaging a static image, turn off the TFT 1004 for refresh, and perform operations along the timing chart in FIG. 10.

In this case, determination of the saturation state by the control circuit 604 or 1007 is described below. As described above, irradiation of light stops each pixel after bringing it to a saturation state. It is allowed to perform this control in accordance with elapsed time. However, it is also possible to monitor the output fluctuation of the MIS-type photoelectric conversion element 217 at the time of light irradiation and perform the control in accordance with the above result. FIGS. 15A to 15D are timing charts respectively showing the relation between driving and output of a two-dimensional sensor when light is irradiated.

Figure 15A:
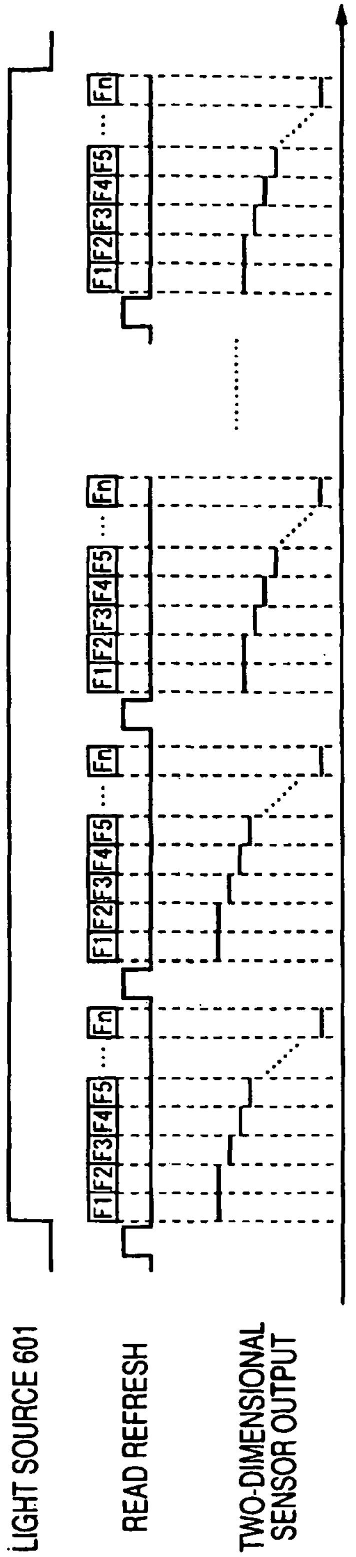
FIG. 15A is a timing chart showing an example of the relation between driving and output of a two-dimensional sensor when light is irradiated.

FIG. 15A shows an output of a two-dimensional sensor when repeating driving for continuously performing read a certain number of times after performing refresh. As shown in FIG. 15A, when repeating read (F1 to Fn) after refresh, an output of the two-dimensional sensor is slowly lowered. This is because electric charges are slowly accumulated in a photoelectric conversion element and sensitivity is lowered. Therefore, by monitoring the difference between outputs of the frame F1 and frame Fn, it is possible to determine irradiation pause time of light. For example, it is allowed to stop irradiation by using that the output difference between the frame F1 and the frame Fn reaches a certain specified value as a condition. Moreover, it is allowed to stop irradiation by using that the output difference between the frame F1 and the frame Fn becomes stable, that is, the output difference becomes smaller than the specified value as a condition. For a photoelectric conversion element to reach a saturation state and for an output of a two-dimensional sensor to become very small, operations of several frames to several tens of frames are necessary. A necessary number of frames depend on the voltage Vs and dose of light.

Figure 15B:
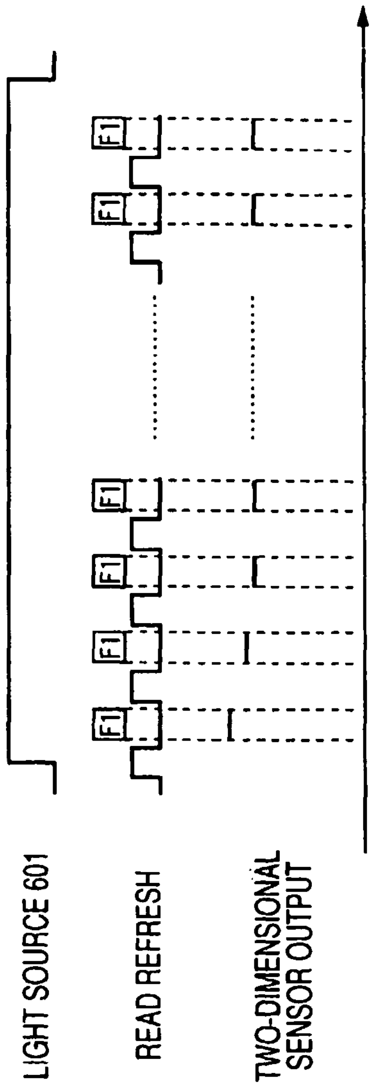
FIG. 15B is a timing chart showing another example of the relation between driving and output of a two-dimensional sensor when light is irradiated.
Figure 15C:
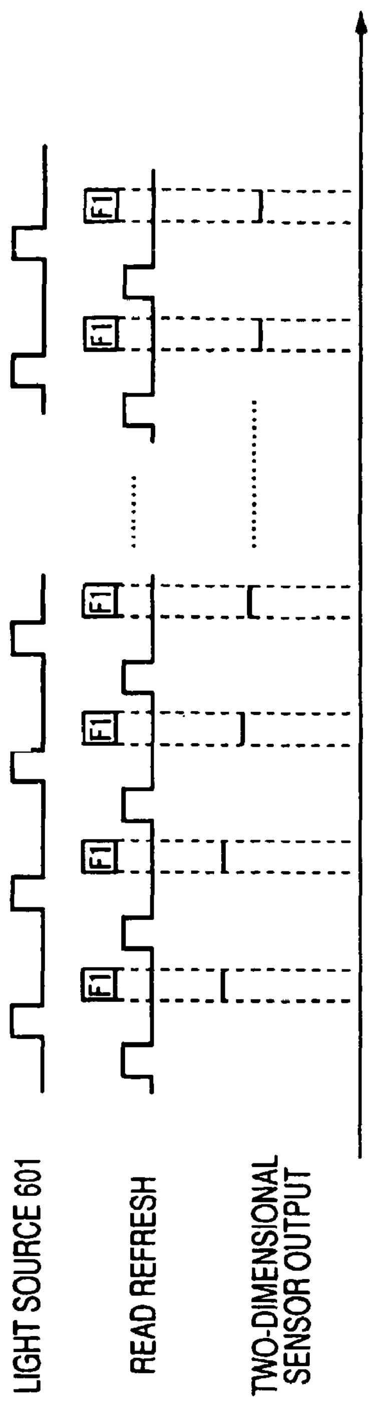
FIG. 15C is a timing chart showing another example of the relation between driving and output of a two-dimensional sensor when light is irradiated.

Though FIG. 15B is an illustration showing driving and output of a two-dimensional sensor when light is irradiated similarly to the case of FIG. 15A, it is different from FIG. 15A in that refresh and read are alternately repeated. In the case of this driving method, it is only necessary to monitor a signal of the frame F1 and stop irradiation of light by using that the change of signals becomes smaller than a specified value as a condition.

Moreover, when the light source 601 has a preferable response characteristic, as shown in FIG. 15C, it is allowed to perform accumulation operation between refresh and read and use a driving method for making the light source 601 emit light during accumulation operation. According to this driving method, it is possible to accurately monitor the output fluctuation of a two-dimensional sensor. Also when using this driving method, it is only necessary to monitor the signal of the frame F1, for example, and stop irradiation of light by using that the change of signals becomes smaller than a specified value as a condition.

Figure 15D:
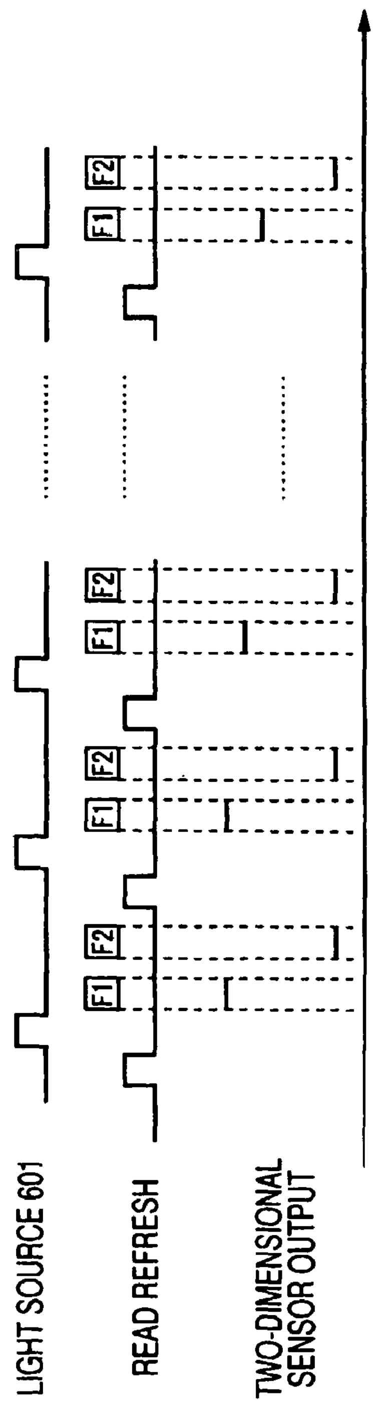
FIG. 15D is a timing chart showing still another example of the relation between driving and output of a two-dimensional sensor when light is irradiated.

Moreover, as shown in FIG. 15D, it is allowed to perform the read operation which does not irradiate light after read after irradiation of light and monitor an output obtained by subtracting the last signal from the signal at that time, that is, the difference value between the frame F1 and the frame F2. According to this method, a component serving as a dark current of a photoelectric conversion element and the factor of an error such as a residual image are removed and it is possible to monitor output fluctuation at higher accuracy. When using this driving method, it is only necessary to stop irradiation of light by using that a difference value becomes smaller than a specified value as a condition.

Figure 16:
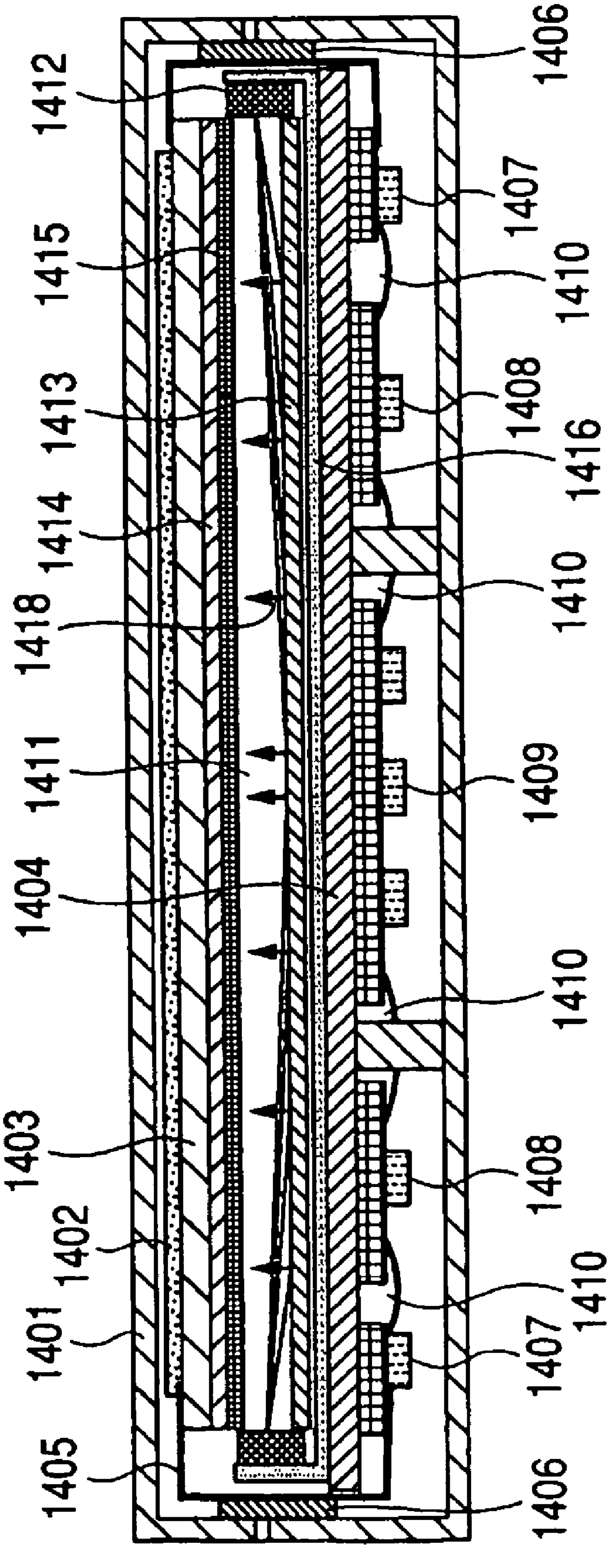
FIG. 16 is an illustration showing an example of the embodiment of the X-ray imaging apparatus of an embodiment of the present invention.

Then, the embodiment of an X-ray imaging device is described below. FIG. 16 is an illustration showing an example of an embodiment of the X-ray imaging apparatus of an embodiment of the present invention. A glass substrate 1403 on which a phosphor 1402 and a two-dimensional sensor are formed is housed in a housing 1401 made of aluminum alloy or magnesium alloy. An IC 1406 including the signal amplifying circuit 802, sample-and-hold circuit 803, and multiplexer 804 is connected to a glass substrate 1403 through a tape carrier package (TCP) 1405. Moreover, the IC is connected to a relay board 1407, A/D board 1408, and system board 1409 through the TCP 1405. The relay board 1407 delivers a signal from the IC 1406, various power supply, and a control signal. The A/D board 1408 includes the A/D converter 806 and converts a signal from a two-dimensional sensor into a digital signal. The system board 1409 controls the two-dimensional sensor and various boards. Moreover, the boards are electrically connected by a signal cable 1410. Moreover, the boards are fixed by a support substrate 1404. An imaging unit is constituted of the above boards.

A light source 1412 corresponding to the light source 601 is further included in the housing 1401. A light guide plate 1411 is set on a light source tray 1416 and a light source 1412 is set to the both ends of the light guide plate 1411. Moreover, a reflection sheet 1413 for completely sending the light emitted from the light source 1412 toward the glass substrate 1403 is set between the light guide plate 1411 and the light source tray 1416. Furthermore, a prism sheet 1415 and diffusion sheet 1414 for uniformly diffusing the light from the light guide plate 1411 are set. Thus, a light source unit is constituted. Though it is preferable to use an LED by which light emission is easily turned on/off as the light source 1412, it is allowed to use a cold cathode.

In the case of an X-ray imaging apparatus thus constituted, light 1418 emitted from the light source 1412 propagates through the light guide plate 1411 and is reflected immediately upward by a reflection pattern set in the light guide plate 1411 in the process of propagation. In this case, the light to be leaked to the downside of the light guide plate 1411 is returned to the light guide plate 1411 by a reflection sheet. Then, the light reflected immediately upward and the light leaked to the upper portion of the light guide plate 1411 by the light guide plate 1411 are diffused by the prism sheet 1415 and diffusion sheet 1414 and uniformly irradiated to the glass substrate 1403. The reflection sheet 1413, diffusion sheet 1414, and prism sheet 1415 are not always necessary. It is allowed to use them according to necessity.

Figure 17:
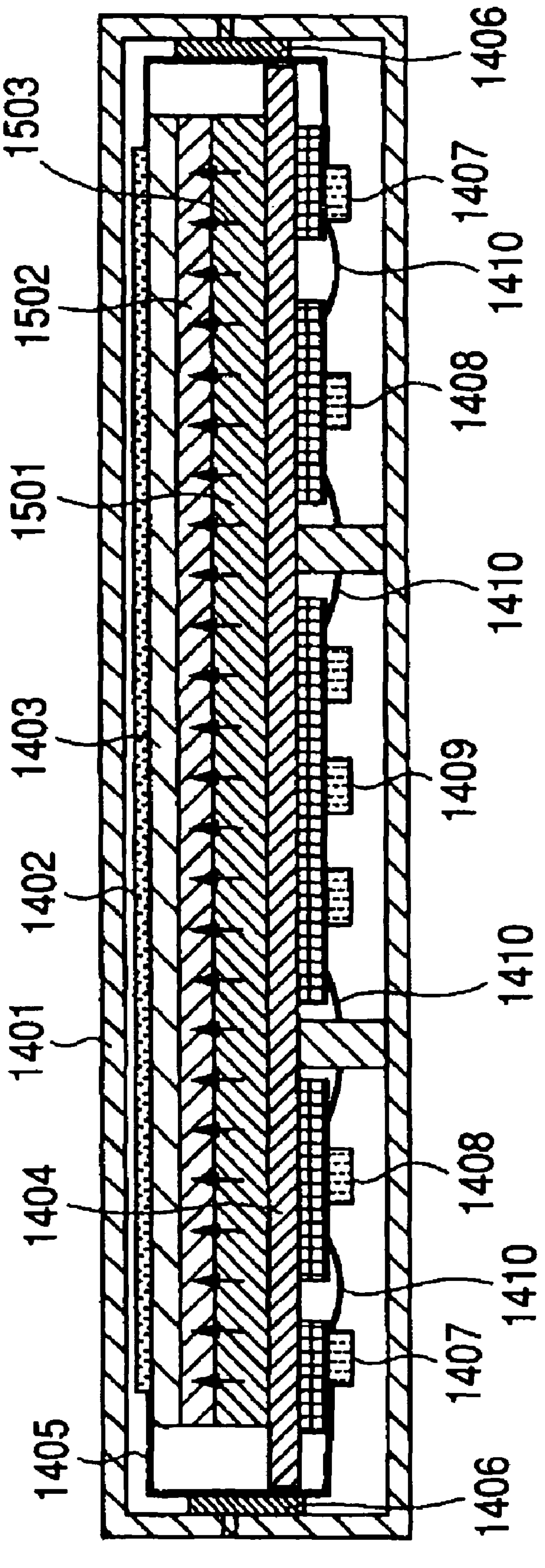
FIG. 17 is an illustration showing another example of an embodiment of the X-ray imaging apparatus of the embodiment of the present invention.
Figure 18:
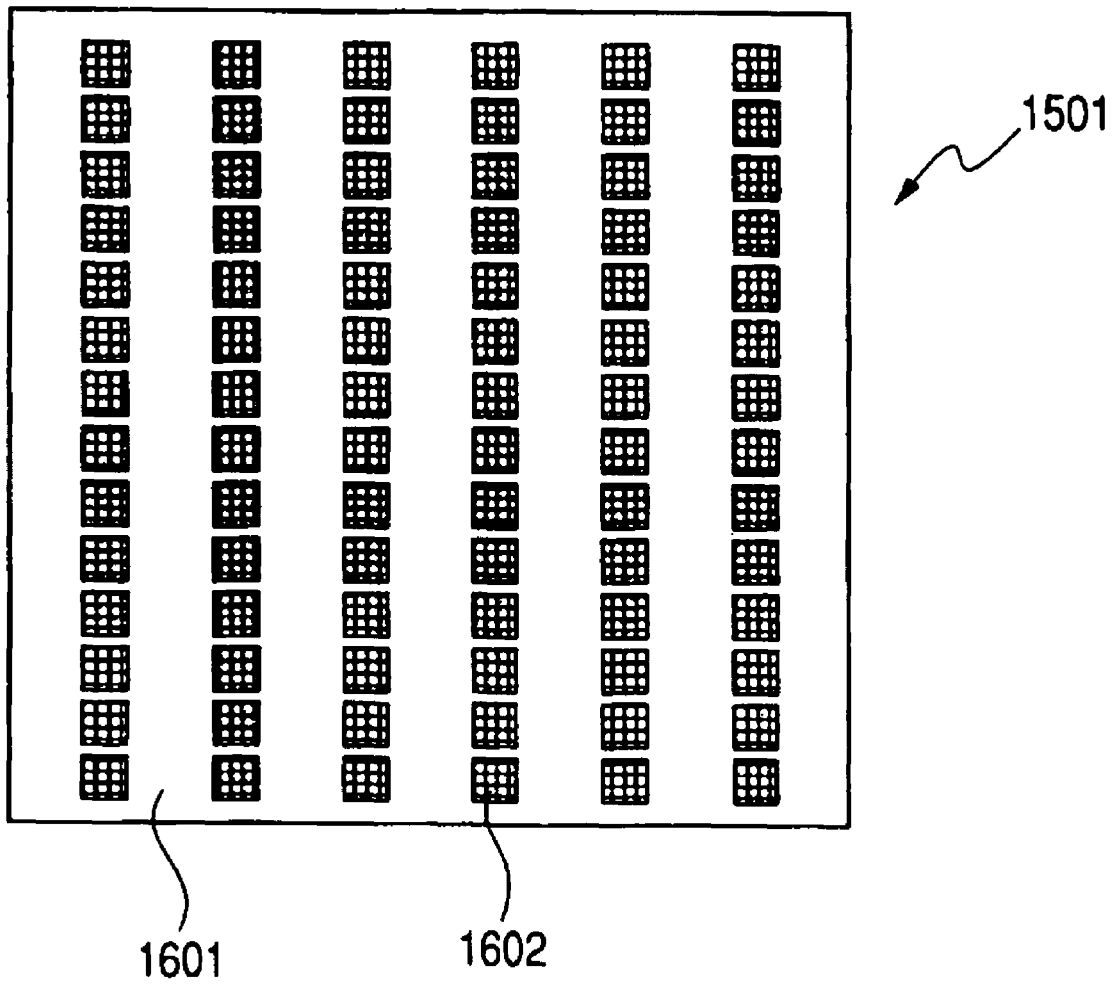
FIG. 18 is an illustration showing an example of a surface-emission device.

Moreover, as shown in FIG. 17, it is allowed to use a surface-emission device 1501 such as an organic EL or inorganic EL. In this case, a diffusion sheet 1502 is set on the surface-emission device 1501 so that the light 1503 propagates through the inside of the sheet 1502. Furthermore, it is allowed to use a device in which LEDs 1602 are two-dimensionally arranged on a print substrate 1601 as a surface-emission device 1501 as shown in FIG. 18.

Figure 19:
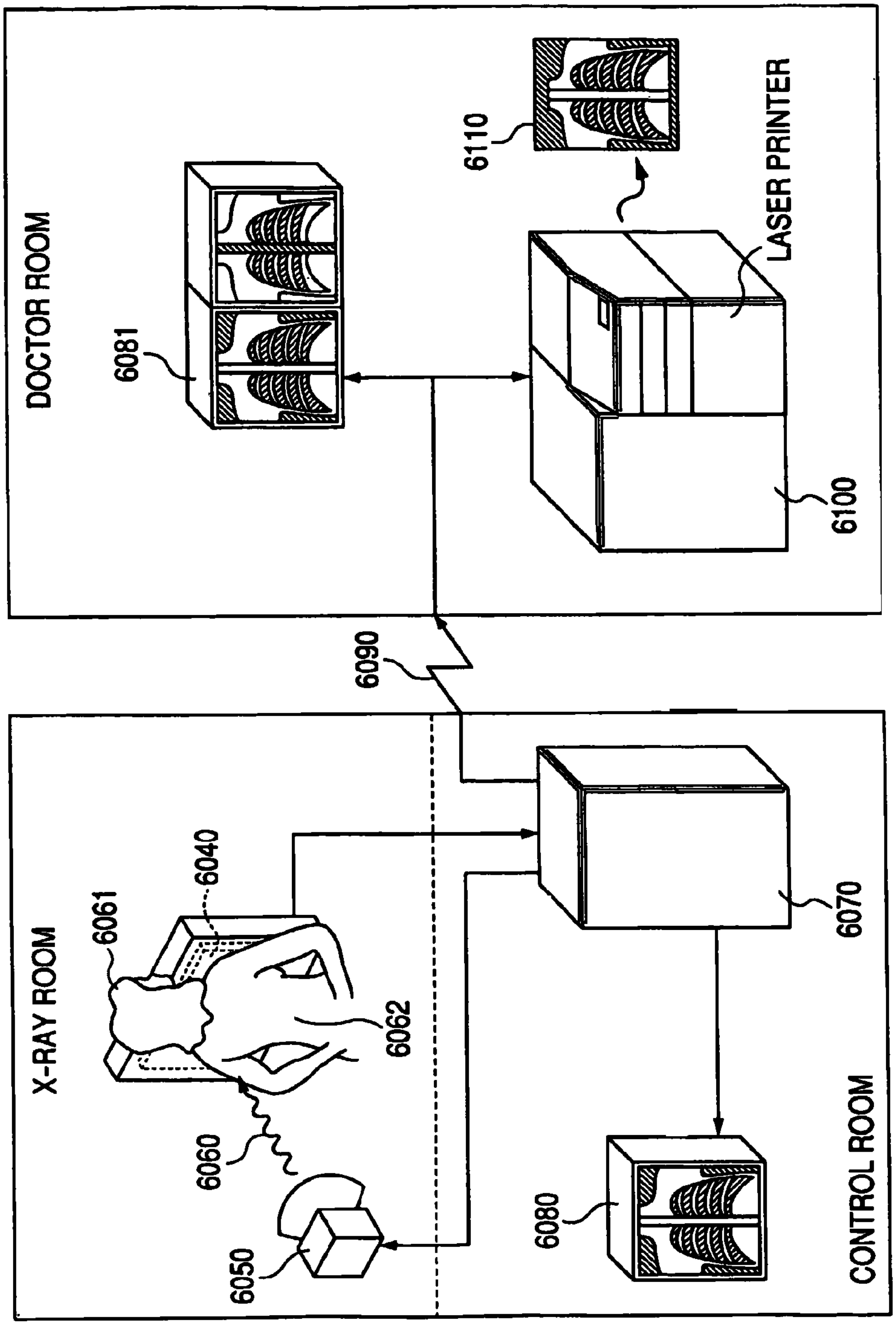
FIG. 19 is a schematic view showing the configuration of an X-ray imaging system.

Then, an irradiation example of the X-ray imaging apparatus of an embodiment of the present invention to an X-ray-image imaging system is described. FIG. 19 is a schematic view showing the configuration of an X-ray-image imaging system.

X ray 6060 generated by an X-ray tube 6050 (X-ray source 119) passes through the chest region 6062 of a patient or subject 6061 and enters an image sensor 6040 including an X-ray imaging apparatus. The information on the inside of the body of the patient 6061 is included in the entered X ray. A scintillator (phosphor) emits light correspondingly to the entrance of the X ray 6060, the photoelectric conversion element of a sensor panel photoelectrically converts the light, and electrical information is obtained. The image sensor 6040 outputs the information to an image processor 6070 as an electrical signal (digital signal). The image processor 6070 serving as image processing means applies image processing to the received signal and outputs the signal to a display 6080 serving as display means of a control chamber. A user observes an image displayed on the display 6080 and can obtain the information on the inside of the body of the patient 6061. The image processor 6070 also has the function of control means and is able to change the imaging mode of dynamic image/static image or control the X-ray tube (X-ray generator) 6050.

Moreover, the image processor 6070 transfers an electrical signal output from the image sensor 6040 to a remote place through transmission processing means such as a telephone line 6090 and is able to displays the signal on display means (display) 6081 present at another place such as a doctor room. Furthermore, the image processor 6070 stores an electrical signal output from the image sensor 6040 in recording means such as an optical disk and a remote-place doctor can perform diagnosis by using the recording means. Furthermore, it is possible to record the electrical signal in a film 6110 by a film processor 6100 serving as recording means. Furthermore, the doctor can enlarge or contract an image displayed on the display 6081, image-process the image to a desired density, and performs the processing such as the difference with another image, and perform diagnosis in accordance with them.

An embodiment of the present invention can be realized when, for example, a computer executes a program. Moreover, means for supplying a program to a computer, for example, a computer-readable recording medium such as a CD-ROM storing the program or transmission medium such as the Internet for transmitting the program can be applied as an embodiment of the present invention. Moreover, it is possible to apply the above program as an embodiment of the present invention. The above program, recording medium, transmission medium, and program product are included in the category of the present invention.

CAPABLE OF EXPLOITATION IN INDUSTRY

The present invention is preferably used for a radiation imaging apparatus preferably used for medical-care diagnosis and industrial nondestructive inspection.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2005-344537, filed Nov. 29, 2005 and 2006-305241, filed Nov. 10, 2006, which are hereby incorporated by reference herein in its entirety.

The invention claimed is:

1. A radiation imaging apparatus comprising:
- a sensor unit for acquiring an image signal from radiation, the sensor unit including a pixel having an MIS-type conversion element;
- a light source for irradiating the MIS-type conversion element with a light having a wavelength range which can be detected by the MIS-type conversion element; and
- a control unit for controlling at least the light source, wherein the control unit controls the light source so as to emit the light to the MIS-type conversion element until the MIS-type conversion element becomes a saturation state before radiation is applied to the sensor unit.

2. The radiation imaging apparatus according to claim 1, wherein the light source is set to the opposite side to the incident side of the radiation of the MIS-type conversion element.

3. The radiation imaging apparatus according to claim 1, wherein the control unit performs control so as to detect that the MIS-type conversion element is a saturation state and complete emission of light from the light source.

4. The radiation imaging apparatus according to claim 3, wherein the control unit performs control so as to detect that the MIS-type conversion element is a saturation state in accordance with a signal from the sensor unit to which the light is irradiated and complete emission of light from the light source.

5. The radiation imaging apparatus according to claim 3, wherein the control unit performs control so as to detect that the MIS-type conversion element is a saturation state in accordance with the time in which the light is irradiated to the sensor unit and complete emission of the light from the light source.

6. The radiation imaging apparatus according to claim 1, wherein the control unit controls the light source so as to emit the light to the MIS-type conversion element until the MIS-type conversion element becomes a saturation state after an imaging state for supplying voltage to the MIS-type conversion element from a pause state in which voltage is not supplied to the MIS-type conversion element.

7. The radiation imaging apparatus according to claim 1, further comprising a driving circuit for driving and controlling the sensor unit and a signal processing circuit for reading the image signal from the detection means.

8. The radiation imaging apparatus according to claim 1, wherein in the case of the sensor unit, at least the MIS-type conversion element and the pixel including a transistor are two-dimensionally arranged and amorphous silicon is used as the material of the MIS-type conversion element.

9. The radiation imaging apparatus according to claim 1, wherein a wavelength conversion body set to the incident side of the radiation of the MIS-type conversion element to convert the wavelength of the radiation is included.

10. The radiation imaging apparatus according to claim 1, wherein a first power supply for supplying a reference voltage to the MIS-type conversion element and a second power supply for supplying the voltage for refresh to the MIS-type conversion element are included.

11. The radiation imaging apparatus according to claim 10, wherein the pixel has a transistor connected between the second power supply and the MIS-type conversion element.

12. A radiation-imaging-apparatus control method including the following:

a step of irradiating, with a light having a wavelength range which can be detected by an MIS-type conversion element from a light source, a sensor unit including a pixel having the MIS-type conversion element until the MIS-type conversion element becomes a saturation state; and a step of acquiring an image signal in which radiation is irradiated to the sensor unit after the step of irradiating the light.

13. A non-transitory computer-readable recording medium storing a program to operate a radiation imaging apparatus such that, after irradiating a sensor unit including a pixel having an MIS-type conversion element with a radiation having a wavelength range which can be detected by the MIS-type conversion element until the MIS-type conversion element becomes a saturation state, the radiation imaging apparatus acquires an image signal based on the radiation with which the sensor unit is irradiated.

* * * * *